United States Patent
Yamada et al.

(10) Patent No.: US 8,229,384 B2
(45) Date of Patent: Jul. 24, 2012

(54) FILTER CIRCUIT AND RECEIVING APPARATUS

(75) Inventors: Masaaki Yamada, Yokohama (JP);
Yusaku Katsube, Yokohama (JP);
Junichi Takahashi, Yokohama (JP);
Toshihito Habuka, Tamamura (JP);
Fumihito Yamaguchi, Maebashi (JP)

(73) Assignee: Renesas Electronics Corporation, Kanagawa (JP)

( * ) Notice: Subject to any disclaimer, the term of this patent is extended or adjusted under 35 U.S.C. 154(b) by 398 days.

(21) Appl. No.: 12/419,355

(22) Filed: Apr. 7, 2009

(65) Prior Publication Data

US 2009/0258626 A1 Oct. 15, 2009

(30) Foreign Application Priority Data

Apr. 9, 2008 (JP) ................................. 2008-101481

(51) Int. Cl.
*H04B 1/06* (2006.01)
(52) U.S. Cl. ........................................ 455/266; 327/553
(58) Field of Classification Search .................. 455/205, 455/266, 307, 338–340; 327/553, 554, 539, 327/559
See application file for complete search history.

(56) References Cited

U.S. PATENT DOCUMENTS

| | | | | |
|---|---|---|---|---|
| 3,781,697 A | * | 12/1973 | Bruinshorst et al. | 327/554 |
| 3,882,362 A | * | 5/1975 | Watanabe | 361/140 |
| 4,072,906 A | * | 2/1978 | Schroder | 330/86 |
| 4,216,434 A | * | 8/1980 | Wermuth | 330/86 |
| 4,634,971 A | * | 1/1987 | Johnson et al. | 324/133 |
| 4,739,189 A | * | 4/1988 | Kellogg | 327/555 |
| 4,783,635 A | * | 11/1988 | Sevastopoulos | 330/107 |
| 6,771,135 B2 | * | 8/2004 | Kubo et al. | 331/66 |
| 6,784,728 B2 | * | 8/2004 | Fischer | 327/554 |
| 7,236,062 B2 | * | 6/2007 | Chien | 331/158 |
| 7,248,105 B2 | * | 7/2007 | Koen | 330/9 |
| 7,257,178 B2 | * | 8/2007 | Ichihara | 375/345 |
| 7,454,186 B2 | * | 11/2008 | Yoneda et al. | 455/324 |
| 7,933,575 B2 | * | 4/2011 | Chung et al. | 455/307 |
| 2006/0229043 A1 | * | 10/2006 | Kurimoto | 455/234.1 |
| 2009/0290728 A1 | * | 11/2009 | Berg | 381/121 |
| 2011/0026507 A1 | * | 2/2011 | Katsube et al. | 370/338 |

FOREIGN PATENT DOCUMENTS

JP 2005-086810 A 10/2005

* cited by examiner

*Primary Examiner* — Thomas J Hiltunen
(74) *Attorney, Agent, or Firm* — Mattingly & Malur, PC

(57) ABSTRACT

A filter circuit includes first capacitors, second capacitors capable of altering a cutoff frequency by being connected in parallel with the first capacitors, first switches for connecting the second capacitors in parallel with the first capacitors, and charging circuits for the second capacitors. The charging circuits include second switches, and resistances for attenuating the amplitudes of input voltages to be fed to the second capacitors, by being connected in series with the second capacitors. The second capacitors are charged through the resistances in a state where the first switches are turned OFF and where the second switches are turned ON. Thus, a DC offset which is ascribable to the cutoff frequency switching of a filter is reduced.

8 Claims, 16 Drawing Sheets

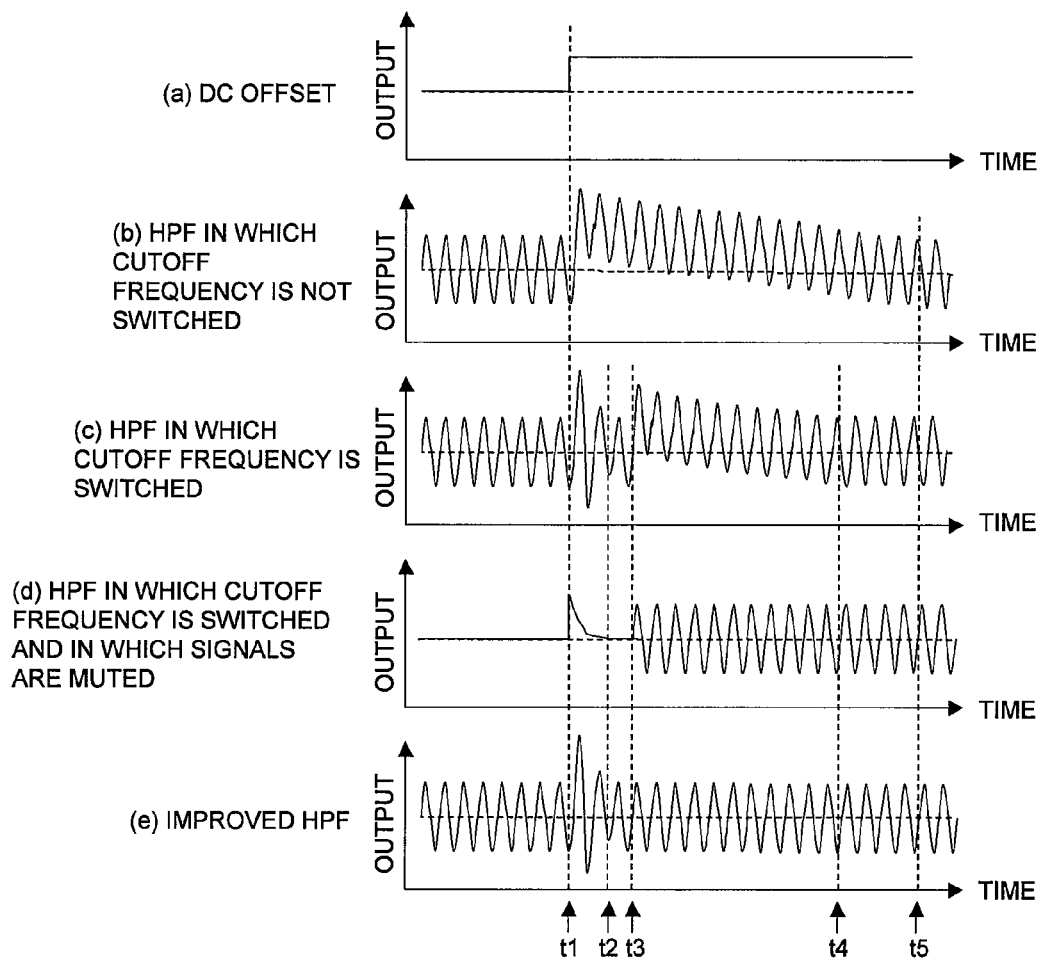
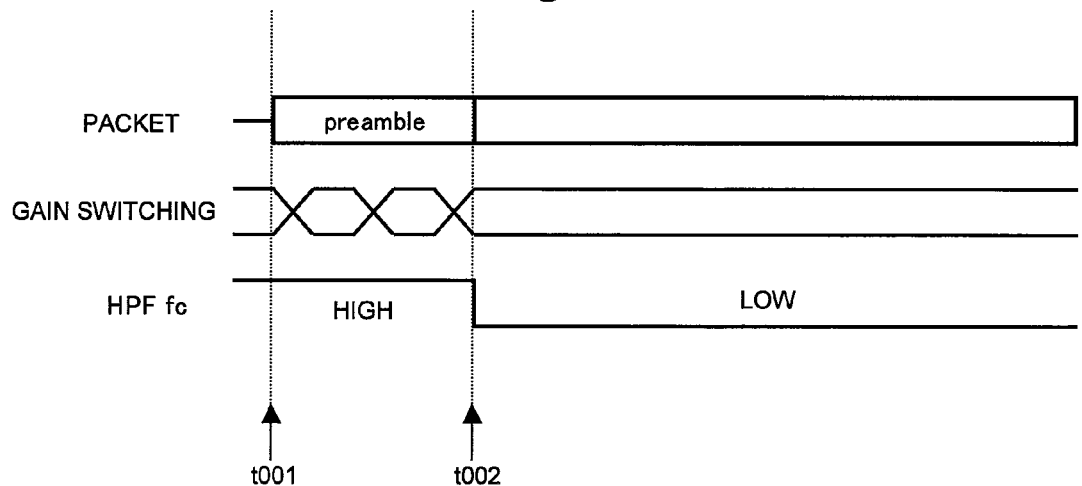

FILTER CIRCUIT AND RECEIVING APPARATUS

CLAIM OF PRIORITY

The present application claims priority from Japanese application JP 2008-101481 filed on Apr. 9, 2008, the content of which is hereby incorporated by reference into this application.

FIELD OF THE INVENTION

The present invention relates to a filter circuit, and a receiving apparatus which is configured including the filter circuit.

BACKGROUND OF THE INVENTION

In the receiving apparatus of a semiconductor integrated circuit for radio use as processes an RF (Radio Frequency) signal which is used in a portable terminal or the like, a superheterodyne scheme and a direct conversion scheme have been generally known as methods for a frequency conversion from an RF bandwidth into a baseband frequency bandwidth (low-frequency bandwidth). The superheterodyne scheme is a scheme wherein a reception frequency is converted by performing a plurality of times of downconversions as from the RF bandwidth into an intermediate frequency (IF) bandwidth and from the IF bandwidth into the baseband frequency bandwidth. On the other hand, the direct conversion scheme is a scheme wherein the RF bandwidth is frequency-converted directly into the baseband frequency bandwidth by one time of downconversion.

When compared with the heterodyne scheme which uses the IF bandwidth, the direct conversion scheme can decrease high-frequency circuits, IF filters, etc. Therefore, this scheme has the advantages of reduction in size, etc. and is often applied presently to the high-frequency ICs (Integrated Circuits), etc. of the portable terminal. The direct conversion scheme, however, has the problem that a signal deterioration is incurred by the fluctuation (DC offset) of a DC (Direct Current) attributed to flicker noise or self-mixing. Here, the flicker noise is noise which exists in the vicinity of the DC and which increases in inverse proportion to the frequency. The deterioration of a desired signal due to the DC offset is not limited to the direct conversion scheme, and it becomes especially problematic. Moreover, the settling time period of a transient signal as arises in case that a gain has been switched in a baseband unit for processing a baseband signal, sometimes becomes problematic. It is known that a high-pass filter (HPF) is generally employed in order to eliminate the DC offset mentioned above. The HPF removes the low-frequency bandwidth, and its cutoff frequency needs to be made sufficiently low for the purpose of preventing the deterioration of the desired signal which exists in a near-DC bandwidth. A capacitance and a resistance of large values as constitute the HPF are required for making the cutoff frequency sufficiently low. In general, the capacitance and the resistance which have the large values, also enlarge physically and therefore hamper reduction in the size of the HPF. Furthermore, in the case that the capacitance and the resistance having the large values are employed as those constituting the HPF, the time constant of a circuit enlarges, and hence, a long time is expended till the settling of the gain.

Patent Document 1 being JP-A-2005-286810 discloses a method wherein, in a radio terminal of direct conversion scheme, the cutoff frequency of an HPF is switched in order to perform a high-speed operation while eliminating a DC offset. More specifically, the cutoff frequency is set high for shortening a gain settling time period, and it is set low in a period for which the deterioration of a desired signal is prevented, whereby the high-speed operation can be performed with the DC offset eliminated.

SUMMARY OF THE INVENTION

As stated above, Patent Document 1 discloses the technique wherein, in the radio terminal of the direct conversion scheme, the cutoff frequency of the HPF is switched. The inventor's study on the above related art technique, however, has revealed that a period for muting the signal is required in the case of switching the cutoff frequency, so the signal cannot be received during the period. In, for example, a radio LAN system in which a gain needs to be set at high speed in a preamble period, a preamble signal might fail to be received on account of the existence of the mute period.

An object of the present invention is to provide a technique for decreasing a DC offset which is ascribable to the cutoff frequency switching of a filter.

The above and other objects and novel features of the invention will become apparent from the description of this specification when read in conjunction with the accompanying drawings.

A preferred aspect of performance of the invention is briefly described as follows:

A filter circuit includes first capacitors, second capacitors capable of altering a cutoff frequency by being connected in parallel with the first capacitors, first switches for connecting the second capacitors in parallel with the first capacitors, and charging circuits for charging the second capacitors. The charging circuits include second switches, and resistances which are connected in series with the second capacitors, thereby to attenuate the amplitudes of input voltages that are fed to the second capacitors. A DC offset is decreased in such a way that the second capacitors are charged through the resistances in a state where the first switches are turned OFF and where the second switches are turned ON.

An advantage which is attained by the preferred aspect of performance of the invention is briefly described as follows:

The DC offset which is ascribable to the switching of the cutoff frequency of the filter can be decreased.

BRIEF DESCRIPTION OF THE DRAWINGS

FIG. 5 is a diagram showing the output waveforms of HPFs of various schemes;

FIG. 6 is a time chart concerning the cutoff frequency switching of the HPF shown in FIG. 4;

DETAILED DESCRIPTION OF THE PREFERRED EMBODIMENTS

1. Summary of the Preferred Embodiments

Figure 1:
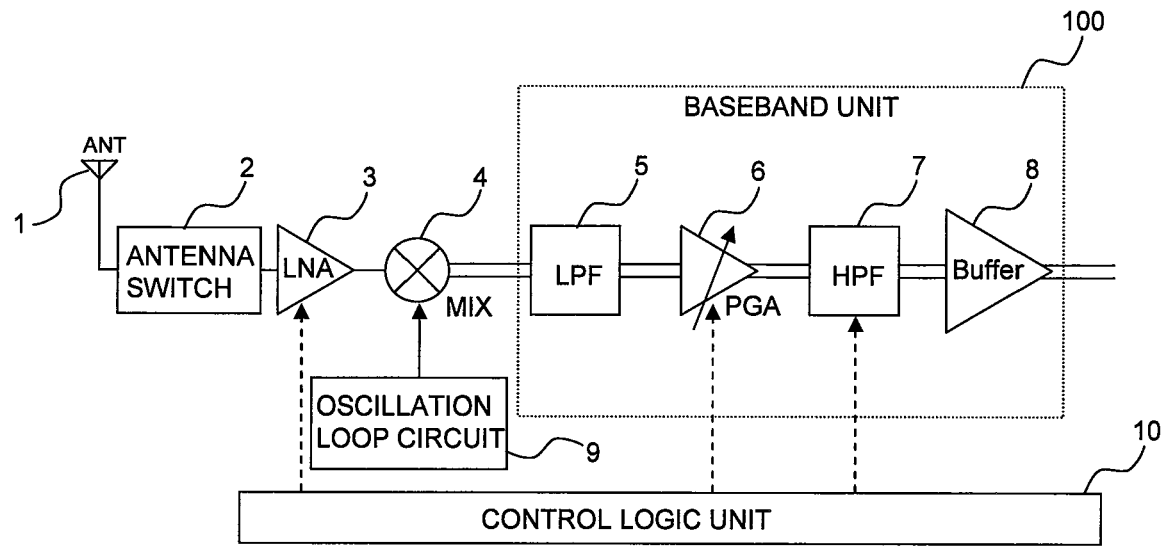
FIG. 1 is a block diagram of a configurational example of a receiving apparatus according to the present invention.

First, the preferred embodiments of the present invention will be briefly described. Reference numerals and signs in the drawings as will be referred to with parentheses in the brief description of the preferred embodiments, shall merely exemplify means or elements which are covered within the concepts of constituents bearing the numerals and signs.

[1] A filter circuit (7) according to the preferred embodiment of the invention includes first capacitors (C1X, C1Y) for forming a high-pass filter, second capacitors (C2X, C2Y) capable of altering the cutoff frequency of the high-pass filter by being connected in parallel with the first capacitors, first switches (SW1X, SW2X, SW1Y, SW2Y) for connecting the second capacitors in parallel with the first capacitors at predetermined timings, and charging circuits for charging the second capacitors. The charging circuits include second switches (SW3X, SW3Y, SW4X, SW4Y) for forming the charging paths of the second capacitors, and resistances (R2X, R2Y) for attenuating the amplitudes of input voltages to be fed to the second capacitors, by being connected in series with the second capacitors. The second capacitors are charged through the resistors in a state where the first switches are turned OFF and where the second switches are turned ON.

[2] From another viewpoint, a filter circuit can be configured including a first input terminal (Xin) for accepting a first input signal, a first filter process unit which executes the filter process of the first input signal inputted through the first input terminal, a first output terminal (Xout) capable of outputting a processed result in the first filter process unit, a second input terminal (Yin) for accepting a second input signal which is in the relation of a complementary level to the first input signal, a second filter process unit which executes the filter process of the second input signal inputted through the second input terminal, and a second output terminal (Yout) capable of outputting a processed result in the second filter process unit. On this occasion, the first filter process unit and the second filter process unit include first capacitors (C1X, C1Y) for forming a high-pass filter, second capacitors (C2X, C2Y) capable of altering the cutoff frequency of the high-pass filter by being connected in parallel with the first capacitors, a first switch (SW1X) capable of coupling one terminal of the second capacitor to one terminal of the first capacitor, a second switch (SW2X) capable of coupling the other terminal of the second capacitor to the other terminal of the first capacitor, a resistance (R2X) for attenuating the amplitude of an input voltage to be fed to the second capacitor, by being connected in series with the second capacitor, a third switch (SW1Y) capable of coupling the resistance to one end of the second capacitor, and a fourth switch (SW4Y) capable of feeding a predetermined bias voltage to the other end of the second capacitor. Besides, the second capacitor is charged through the resistance in a state where the first switch and the second switch are turned OFF and where the third switch and the fourth switch are turned ON.

[3] In the preceding paragraph [2], the first input terminal and the second input terminal can be coupled through the resistance.

[4] In the above paragraph [2], a fifth switch (SW5) which is capable of coupling the first input terminal and the second input terminal through the resistance can be disposed.

[5] A receiving apparatus can be configured including a first amplifier (31) which amplifies a received signal, a mixer (4) which performs a frequency conversion as to the output signal of the first amplifier, and a baseband unit (100) which is arranged at a stage posterior to the mixer and which is capable of processing the output signal of the mixer. On this occasion, the baseband unit can be configured including a low-pass filter unit (5) which executes the filter process of a signal transmitted through the mixer, a second amplifier (6) which amplifies the output signal of the low-pass filter, and a high-pass filter unit (7) which executes the filter process of the output signal of the second amplifier, and the filter circuit described in the paragraph [2] is applicable as the high-pass filter unit.

[6] In the paragraph [5], a control unit (10) which is capable of controlling the gain alteration of the second amplifier and the cutoff frequency alteration of the high-pass filter unit can be disposed.

[7] In the paragraph [6], the control unit can be configured so as to lower the cutoff frequency of the filter circuit after a predetermined time has lapsed since the alteration of a gain in the second amplifier.

[8] A receiving apparatus can be configured including a first amplifier (3) which amplifies a received signal, a mixer (4) which performs a frequency conversion as to the output signal of the first amplifier, and a baseband unit (100) which is arranged at a stage posterior to the mixer and which is capable of processing the output signal of the mixer. On this occasion, the baseband unit can be configured including a first high-pass filter unit (74) which executes the filter process of a signal transmitted through the mixer, a low-pass filter unit (5) which executes the filter process of a signal outputted from the first high-pass filter, a second amplifier (6) which amplifies the output signal of the low-pass filter, and a second high-pass filter unit (5) which executes the filter process of the output signal of the second amplifier, and the filter circuit described in the paragraph [2] is applicable as the first high-pass filter unit and the second high-pass filter unit.

[9] In the paragraph [8], a control unit (10) which is capable of controlling the alterations of gains in the first amplifier and the second amplifier and the alterations of cutoff frequencies in the first high-pass filter unit and the second high-pass filter unit can be disposed.

[10] In the paragraph [9], the control unit can alter the gains of the first amplifier and the second amplifier in this order, and it can lower the cutoff frequency of the first filter unit after a predetermined time since the gain alteration of the first amplifier and can lower the cutoff frequency of the second filter unit after a predetermined time since the gain alteration of the second amplifier.

[11] In the paragraph [5], it is possible to dispose a DC offset canceling circuit (11) which forms a DC offset correction code for canceling a DC offset, on the basis of the signal of the output side of the second amplifier, and which feeds the correction code back to the input side of the amplifier.

[12] In the paragraph [5], it is possible to dispose a DC offset canceling circuit (11) which forms a DC offset correction code for canceling a DC offset, by executing the averaging process of offset information extracted on the basis of the signal of the output side of the second amplifier, and which feeds the correction code back to the input side of the amplifier.

[13] In the paragraph [5], it is possible to dispose a DC offset canceling circuit (11) which forms a DC offset correction code for canceling a DC offset, by executing the averaging process of offset information extracted on the basis of the signal of the output side of the second amplifier, and which feeds the correction code back to the input side of the amplifier, and a DC servo circuit (12) which has a first control mode where a signal following up a DC offset fluctuation of low frequency can be detected and fed back to the input side of the amplifier, and a second control mode where a signal following up a DC offset fluctuation of low frequency is detected so as to revise the DC offset correction code on the basis of the detected signal.

[14] In the paragraph [2], a receiving apparatus can be configured including a first amplifier (3) which amplifies a received signal, a mixer (4) which performs a frequency conversion as to the output signal of the first amplifier, and a baseband unit (100) which is arranged at a stage posterior to the mixer and which is capable of processing the output signal of the mixer. On this occasion, the baseband unit can dispose a low-pass filter (5) which executes the filter process of a signal outputted from the mixer, a second amplifier (61) which amplifies the output signal of the low-pass filter, a third amplifier (62) which amplifies the output signal of the second amplifier, and a high-pass filter unit (7) which executes the filter process of the output signal of the third amplifier, and the filter circuit described in the paragraph [2] is applicable as the high-pass filter unit.

[15] In the paragraph [14], it is possible to dispose a first DC offset canceling circuit (115) which forms a DC offset correction code for canceling a DC offset, on the basis of the signal of the output side of the second amplifier, and which feeds the correction code back to the input side of the second amplifier, and a second DC offset canceling circuit (116) which forms a DC offset correction code for canceling a DC offset, on the basis of the signal of the output side of the third amplifier, and which feeds the correction code back to the input side of the third amplifier.

[16] In the paragraph [14], it is possible to dispose a first DC offset canceling circuit (15) which forms a DC offset correction code for canceling a DC offset, on the basis of the signal of the output side of the second amplifier, and which feeds the correction code back to the input side of the second amplifier, a second DC offset canceling circuit (116) which forms a DC offset correction code for canceling a DC offset, on the basis of the signal of the output side of the third amplifier, and which feeds the correction code back to the input side of the third amplifier, and a DC servo circuit (12) which has a first control mode where a signal following up a DC offset fluctuation of low frequency can be detected and fed back to the input side of the third amplifier, and a second control mode where a signal following up a DC offset fluctuation of low frequency is detected so as to revise the DC offset correction code on the basis of the detected signal.

[17] A receiving apparatus can be configured including a first amplifier (3) which amplifies a received signal, a mixer (4) which performs a frequency conversion as to the output signal of the first amplifier, and a baseband unit (100) which is arranged at a stage posterior to the mixer and which is capable of processing the output signal of the mixer. On this occasion, the baseband unit can be configured including a low-pass filter (5) which executes the filter process of an output signal from the mixer, and a second amplifier (13) which amplifies the output signal of the low-pass filter, while the second amplifier can be configured including a high-pass filter unit (C5X, R7X, C5Y, C7Y) which executes the filter process of the output signal of the low-pass filter, and an amplification unit (231X, 231Y) which is arranged at a stage posterior to the high-pass filter unit and which is capable of adjusting its gain without switching the cutoff frequency of the high-pass filter unit.

[18] In the paragraph [17], the amplification unit can be configured including an operational amplifier (131X, 131Y) which has a non-inverting input terminal, an inverting input terminal and an output terminal and which is capable of amplifying a potential difference between the non-inverting input terminal and the inverting input terminal and then outputting the amplified potential difference from the output terminal, capacitors (C6X, C6Y) which are coupled to the output terminal of the operational amplifier, and feedback resistances (R6X, R6Y) which are capable of feeding the amplified potential difference back to the inverting input terminal of the operational amplifier through the capacitors. In addition, the values of the feedback resistances are altered, whereby the gain adjustment of the operational amplifier can be made.

2. Further Detailed Description of the Preferred Embodiments

Next, the preferred embodiments will be further described in detail.

Now, the best mode for performing the present invention will be described in detail with reference to the drawings by taking a radio LAN (Local Area Network) system as an example. Incidentally, throughout the drawings illustrative of the embodiments, the same numerals or signs are assigned to identical members in principle, and they shall be omitted from repeated description.

<Embodiment 1>

FIG. 1 shows a general configurational example of a receiving apparatus according to the invention.

Although not especially restricted, the receiving apparatus 200 shown in FIG. 1 is configured as a receiving apparatus of direct conversion scheme in which an RF signal is converted into a baseband width directly by one time of conversion. This receiving apparatus 200 is applied as one node to the radio LAN system which has a period capable of gain setting or the like, for example, a preamble period.

The receiving apparatus 200 is configured including an antenna 1 which is capable of transmission and reception, an antenna switch 2 which performs the switching of the transmission and the reception, etc., an LNA 3 (Low Noise Amplifier), an oscillation loop circuit 9 which generates a local signal necessary for a frequency conversion, a mixer 4 (MIX) which performs the frequency conversion, an LPF 5 (Low-Pass Filter) which removes a adjacent channel signal, a PGA 6 (Programmable Gain Amplifier) whose gain is variable with a digital signal, an HPF 7 (High-Pass Filter) which cuts off the low-frequency bandwidth of flicker noise or the like, a buffer 8, and a control logic unit 10 which controls the individual blocks. A signal after the frequency conversion is called the "baseband signal", and a circuit block which handles the baseband signal is called the "baseband unit". In FIG. 1, the baseband unit 100 is configured including the LPF 5, PGA 6, HPF 7 and buffer 8.

The RF signal received by the antenna 1 is distributed to a reception portion by the antenna switch 2 and is amplified by the LNA 3, and the RF signal and the local frequency of the oscillation loop circuit 9 are multiplied by the mixer 4, whereby the RF signal is directly downconverted into the baseband frequency bandwidth. The baseband signal obtained by downconverting the RF signal has the signal of a neighboring channel removed by the LPF 5, and it is amplified by the PGA 6 so as to become a desired amplitude level. The HPF 7 is disposed in order to eliminate DC offset and flicker noise, and its cutoff frequency can be altered. The buffer 8 is disposed at the final stage of the baseband unit 100 in order to ensure isolation, and it outputs the baseband signal.

By the way, in a general radio LAN system, the baseband signals of an in-phase component (I side) and an orthogonal component (Q side) are used for performing an orthogonal demodulation, and circuits corresponding to the respective baseband signals are disposed. However, the I side and the Q side are similarly configured. In this example, therefore, only the I side will be described, and the Q side shall be omitted from description, for convenience' sake.

Next, the HPF 7 will be described in detail.

Figure 4:
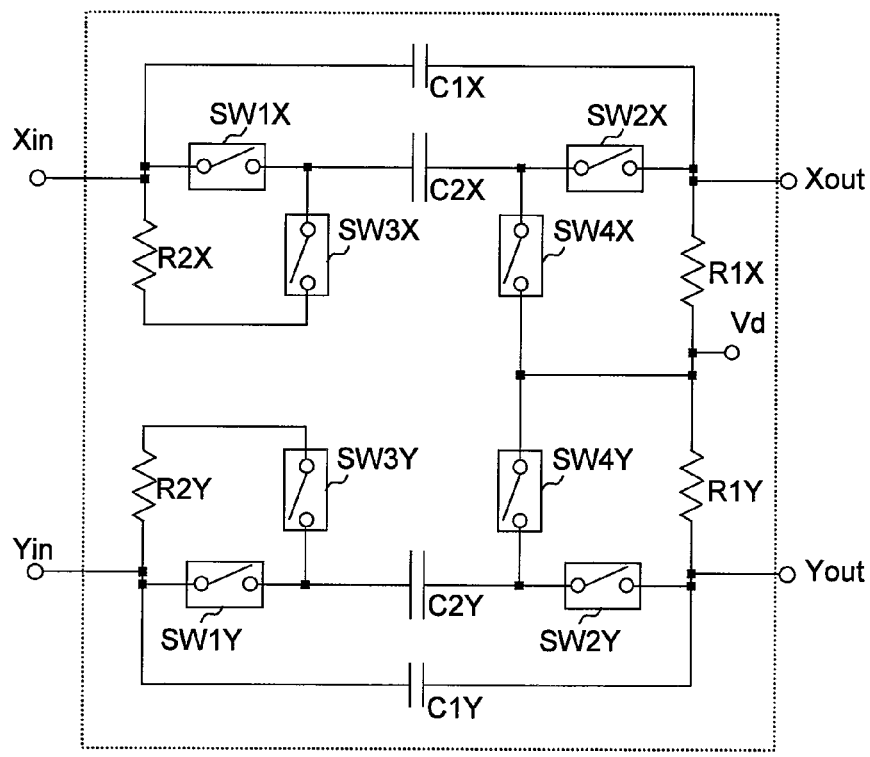
FIG. 4 is a circuit diagram of a configurational example of the HPF which is included in the receiving apparatus shown in FIG. 1.

The HPF 7 shown in FIG. 4 includes resistances R1X and R1Y, capacitors C1X and C1Y, capacitors C2X and C2Y, and switches SW1X, SW1Y, SW2X, SW2Y, SW3X, SW3Y, SW4X and SW4Y.

In case that a cutoff frequency is set high, the resistances R1X and R1Y and the capacitors C1X and C1Y are caused to function. In case that the cutoff frequency is set low, the capacitors C2X and C2Y are concerned with a circuit operation.

The capacitances of the capacitors C1X and C1Y are smaller than those of the capacitors C2X and C2Y (for example, they are on the order of 1/100), and they are connected in series on a main path. In the case where the cutoff frequency is set low, the capacitors C2X and C2Y are respectively connected in parallel with the corresponding capacitors C1X and C1Y. The resistances R1X and R1Y are resistances which constitute the HPF 7, and they are connected between the output terminals and bias voltage Vb of the HPF 7. The second resistance R2 is connected onto the input side of the second capacitor C2 when this second capacitor C2 is charged through the switch SW3.

The switches SW1X and SW1Y are respectively interposed between the input terminals Xin and Yin of the HPF 7 and the second capacitors C2X and C2Y, while the switches SW2X and SW2Y are respectively interposed between the capacitors C2X and C2Y and the output terminals Xout and Yout. The switches SW3X and SW3Y are respectively connected in series with the output sides of the resistances R2X and R2Y, and between the switches SW1X and SW1Y and the capacitors C2X and C2Y.

The switches SW4X and SW4Y are respectively interposed between the outputs of the capacitors C2X and C2Y and the bias voltage Vb. The switches SW1X and SW1Y and the switches SW2X and SW2Y, and the switches SW3X and SW3Y and the switches SW4X and SW4Y perform contradictory operations. In the case that the cutoff frequency is set high, the switches SW1X and SW1Y and the switches SW2X and SW2Y are turned OFF, and the switches SW3X and SW3Y and the switches SW4X and SW4Y are turned ON. On this occasion, the capacitors C2X and C2Y are respectively charged through the resistances R2X and R2Y. In the case that the cutoff frequency is set low, the switches SW1X and SW1Y and the switches SW2X and SW2Y are turned ON, and the switches SW3X and SW3Y and the switches SW4X and SW4Y are turned OFF.

FIG. 6 shows a time chart concerning the switching of the cutoff frequency.

In a packet communication having a preamble period, gain setting is performed in the time period of a time t001 to a time t002. The gain setting is started at the time t001. In order to shorten a gain settling time period, before the time t001, the switches SW1X and SW1Y and the switches SW2X and SW2Y are turned OFF, and the switches SW3X and SW3Y and the switches SW4X and SW4Y are turned ON. Since the HPF 7 is configured of the capacitors C1X and C1Y and the resistances R1X and R1Y, the cutoff frequency becomes high, and the capacitors C2X and C2Y are connected between the inputs fed through the resistances R2X and R2Y and the bias voltage Vb and are rapidly charged. The capacitors C2X and C2Y become an LPF configuration through the resistances R2X and R2Y. Therefore, the capacitor C2 is charged with a certain time constant and is charged so as to be capable of absorbing a generated DC offset, and the charging of a DC offset voltage component which does not depend upon the input amplitude of the filter is permitted.

Subsequently, in order to switch the cutoff frequency with the end of the gain setting at the time t002, the switches SW1X and SW1Y and the switches SW2X and SW2Y are turned ON, and the switches SW3X and SW3Y and the switches SW4X and SW4Y are turned OFF. Since the HPF 7 is configured of the parallel connections of the capacitors C1X and C1Y and the capacitors C2X and C2Y, and the resistances R1X and R1Y, the cutoff frequency becomes low. The capacitors C2X and C2Y are cut off from the filter inputs fed through the resistances R2X and R2Y, and the bias voltage Vb. The cutoff frequency becomes low from the time t002 on, and flicker noise and the DC offset can be eliminated while the deterioration of a desired signal in the vicinity of a DC is prevented. By adopting the configuration shown in FIG. 4, accordingly, it is possible to perform the high-speed gain switching and to eliminate the DC offset even in the radio communication system of short gain setting period as in the radio LAN, and to provide the good receiving apparatus 200 in which the DC offset does not appear at the switching of the cutoff frequency.

Figure 2:
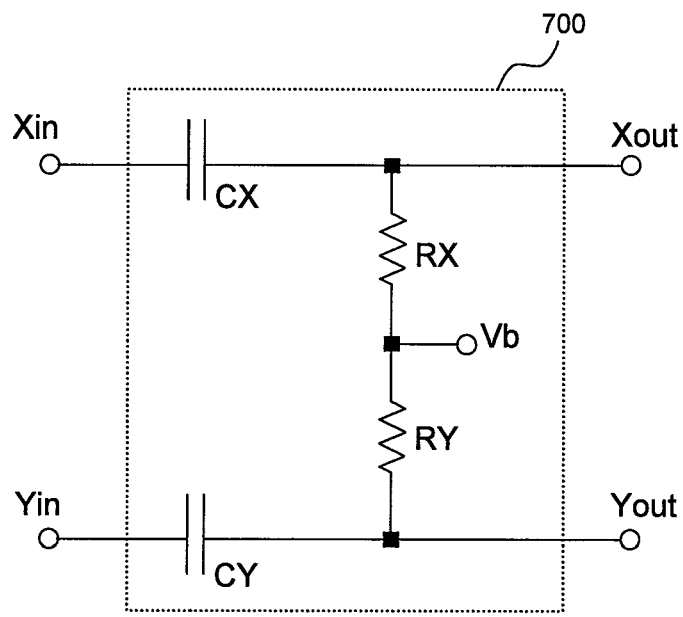
FIG. 2 is a circuit diagram of a configurational example of a circuit which is to be compared with an HPF shown in FIG. 4.
Figure 3:
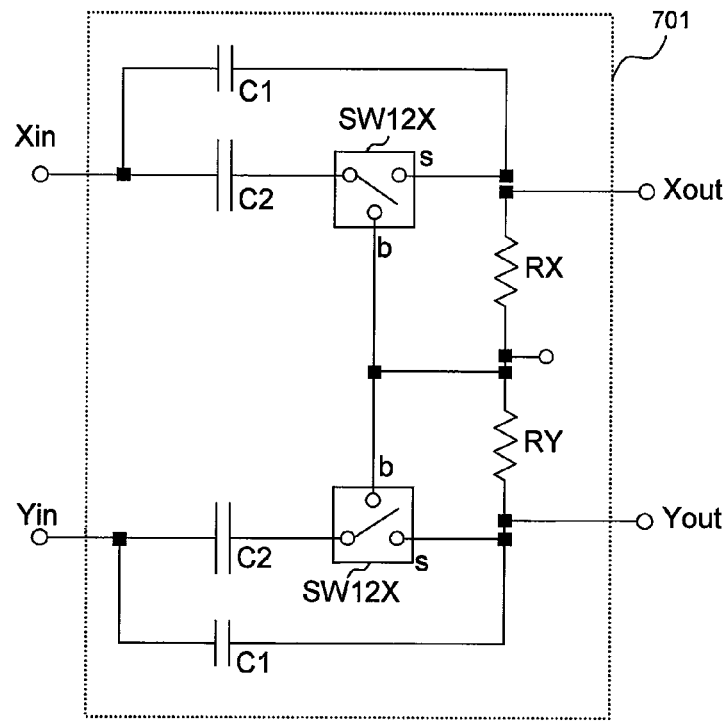
FIG. 3 is a circuit diagram of another configurational example of a circuit which is to be compared with the HPF shown in FIG. 4.

FIGS. 2 and 3 show configurational examples which are to be compared with the HPF 7 shown in FIG. 4.

The HPF 700 shown in FIG. 2 is so configured that capacitors CX and CY and resistances RX and RY are coupled. The cutoff frequency of the HPF 700 is fixed. On the other hand, the HPF 701 shown in FIG. 3 is configured including capacitors C1X and C2X, a switch 12X and a resistance RX and capacitors C1Y and C2Y, a switch 12Y and a resistance RY. When the sides of contacts b are selected by the switches SW12X and SW12Y, the capacitors C2X and C2Y can be charged. When the sides of contacts s are selected by the switches SW12X and SW12Y, the capacitor C2X is connected in parallel with the capacitor C1X, and the capacitor C2Y is connected in parallel with the capacitor C1Y, whereby the cutoff frequency in the HPF 701 is lowered. Here will be considered cases where the HPFs 700 and 701 are applied to the HPF 7 in FIG. 1.

FIG. 5 shows the output waveforms of the HPFs of the respective schemes in the cases where the DC offsets attendant upon gain switchings have appeared in the PGAs 6. In FIG. 5, the axis of ordinates represents the output, and the axis of abscissas is a time axis.

As shown at (a) in FIG. 5, the gain switching is performed in the PGA 6 at a time t1, and the DC offset appears with the gain switching of the PGA 6. In the HPF 700 in which the cutoff frequency is not switched, as shown at (b) in FIG. 5, the resistances R and the capacitors C are previously determined so that the cutoff frequency may become near a DC, in order to prevent the deterioration of a desired signal. The DC offset which has appeared with gain switching at the time t1 converges at a time t5 and requires a long time for the convergence on account of the large time constant of the HPF, so that a signal deteriorates. In the case of the HPF 701 which can switch the cutoff frequency, as shown at (c) in FIG. 5, the sides of the contacts b are selected by the switches SW12 till a time t3, the cutoff frequency is set high, and the capacitors C2 are charged by being connected with a bias voltage Vb. After the time t3, the sides of the contacts s are selected by the switches SW12, and the cutoff frequency is set low. The DC offset attendant upon gain switching at the time t1 converges early at a time t2, owing to the HPF configuration of high cutoff frequency. However, when amplitudes exist in input signals at the time t3 of cutoff frequency switching, input amplitude voltages and a DC offset voltage component are charged into the capacitors C2, and the DC offset of the input amplitude voltage component appears at the time t3. Due to the low cutoff frequency and the large time constant, this DC offset converges at a time t4 and requires a long time for the convergence, so that a signal deteriorates. In order to block the signal deterioration, the input signals may be muted till the time t3. A signal output waveform in this case is shown at (d) in FIG. 5. Regarding (d) in FIG. 5, the configurations of the HPF for switching the cutoff frequency and muting the signal are the same as those of the HPF 701, and the input signals are muted till the time t3, whereas the inputs of the input signals are restarted after the time t3. Owing to the HPF configuration of high cutoff frequency, the DC offset attendant upon gain switching at the time t1 converges early at the time t2. Since the input signals are muted at the time t3 of the switching of the cutoff frequency, the input amplitude does not exist, and only the DC offset voltage component is charged into the capacitors C2. Accordingly, even when the cutoff frequency is switched at the time t3, the output free from the DC offset is obtained. Since, however, the input signals need to be muted till the time t3, the preamble signal fails to be received in the radio LAN system in which the gain setting needs to be performed at high speed in the preamble period.

In contrast, according to the configuration shown in FIG. 4, as shown at (e) in FIG. 5, the cutoff frequency is set high till the time t3, and it is set low at the time t3. Owing to the HPF configuration of high cutoff frequency, the DC offset attendant upon gain switching at the time t1 converges early at the time t2. The capacitors C2X and C2Y which are used for the cutoff frequency switching are charged by the LPF configuration through the resistances R2X and R2Y, whereby the input amplitudes can be removed without muting the input signals. That is, the input amplitudes are attenuated by the LPF configuration, and the capacitors C2X and C2Y are charged with the DC offset voltage component, so that the DC offset is not generated even when the cutoff frequency is switched at the time t3. In this manner, according to the configuration shown in FIG. 4, the high-speed gain settling and the DC offset elimination can be attained without muting the input signals.

By the way, in the configurational example of FIG. 4, it has been described that the output sides of the capacitors C2X and C2Y are connected to the bias voltage Vb during the charging. However, this aspect is not restrictive, but a more rapid charging is permitted by, for example, switching also a current which flows to the bias voltage Vb, so that a large current may flow during the charging.

It has been described that the insertion position of the HPF 7 is the stage posterior to the PGA 6. However, this is not restrictive, but the insertion position of the HPF 7 may well be, for example, a stage prior to the PGA 6 in a case where a DC offset does not appear in the PGA 6.

It has been described that the timing of the cutoff frequency switching is the time of the end of the gain setting. However, this is not restrictive, but the cutoff frequency may well be switched, for example, by providing a timer or at the end of the preamble period.

It has been described that the timings of the cutoff frequency switching and the charging are simultaneous. However, this is not restrictive, but a charging period may well be set, for example, earlier than the timing of the cutoff frequency switching.

<Embodiment 2>

Figure 7:
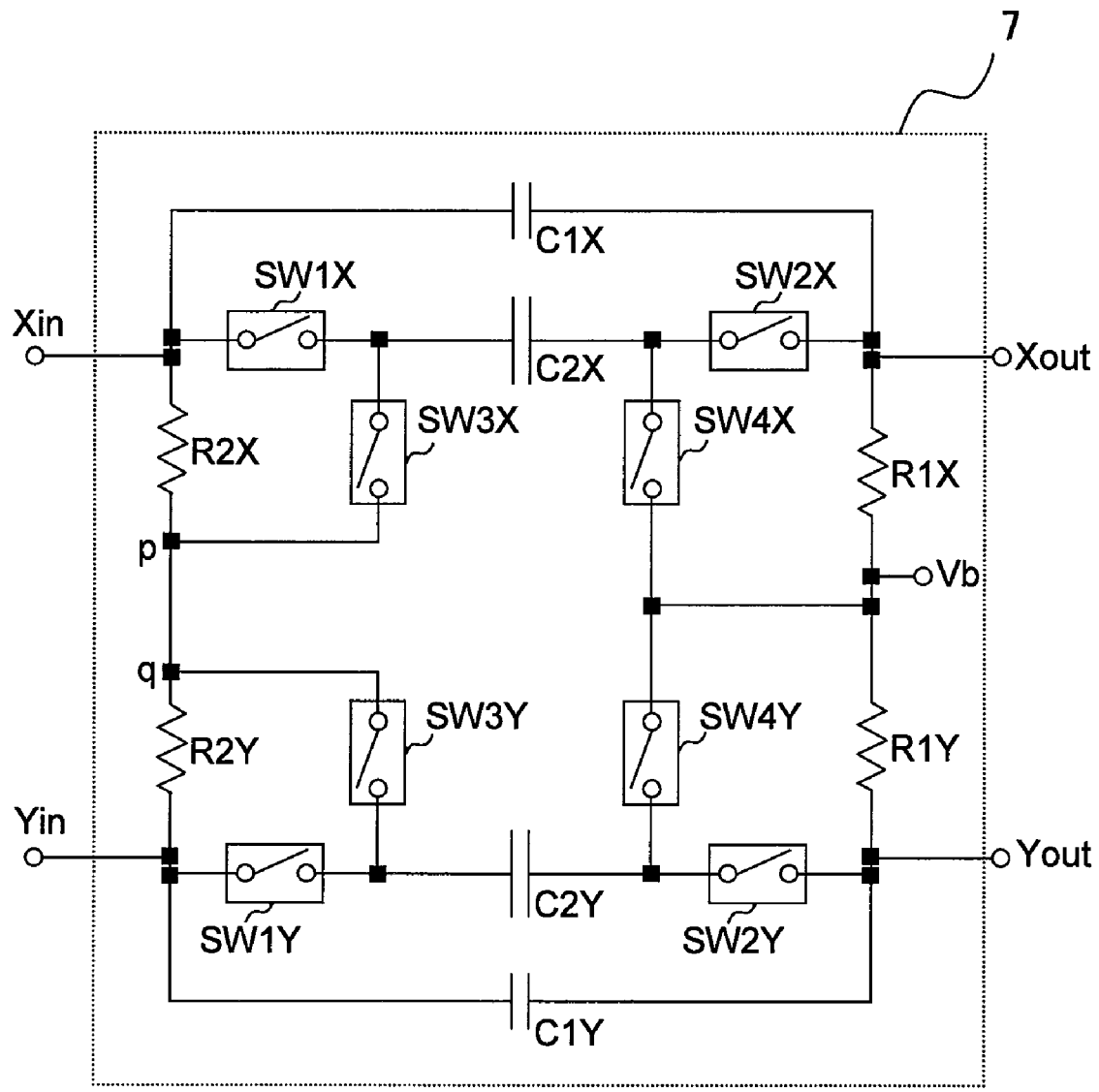
FIG. 7 is a circuit diagram of another configurational example of the HPF which is included in the receiving apparatus shown in FIG. 1.

Another configurational example of the HPF 7 is shown in FIG. 7.

The configuration shown in FIG. 7 is greatly different from the configuration shown in FIG. 4, in that points p and q are short-circuited. In Embodiment 1, the second capacitors C2 are charged by the inputs fed through the second resistors R2, and the bias voltage Vb, thereby to suppress the dependency of the input amplitudes. However, in a case where the input amplitudes are larger, the amplitude dependency is apprehended to appear conspicuously. As shown in FIG. 7, therefore, the differential input terminals Xin and Yin are short-circuited through the resistances R2X and R2Y, and the capacitors C2 are charged in that state.

In the case where the cutoff frequency is set high, the input sides of the capacitors C2X and C2Y are respectively connected with the points p and q through the resistances R2X and R2Y, the output sides of the capacitors 2 are connected to the bias voltage Vb, and the capacitors C2X and C2Y are charged in that state. Notwithstanding that the amplitude of the differential input exists at the input terminals Xin and Yin, it is canceled at the points p and q by the short-circuiting thereof. Consequently, only the DC component remains, and the charging of the capacitor C2 can be favorably performed without the dependency of the input amplitude.

Incidentally, the remaining circuit configuration and operation are the same as shown in FIG. 4 and shall therefore be omitted.

For the above reasons, also in the case of adopting the configuration shown in FIG. 4, high-speed gain switching and the elimination of the DC offset can be performed in a radio communication system of short gain setting period such as a radio LAN. Besides, the DC offset can be reliably eliminated even in an RF signal input of comparatively large amplitude, and a good receiving apparatus can be provided.

<Embodiment 3>

Figure 8:
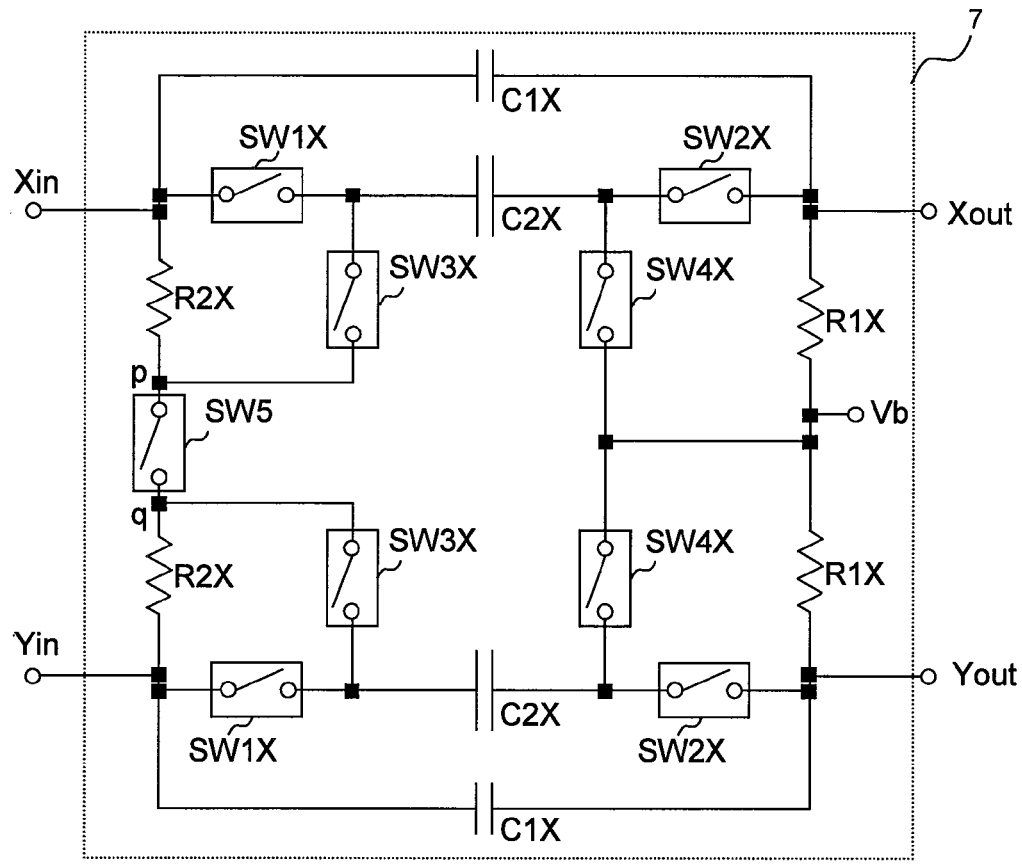
FIG. 8 is a circuit diagram of still another configurational example of the HPF which is included in the receiving apparatus shown in FIG. 1.

Another configurational example of the HPF 7 is shown in FIG. 8.

The configuration shown in FIG. 8 is greatly different from the configurations shown in FIGS. 4 and 7, in that a switch SW5 is interposed between the points p and q.

The switch SW5 is controlled by the control logic unit 10. The configuration shown in FIG. 8 becomes equivalent to the configuration shown in FIG. 4, in a case where the switch SW5 has been turned OFF, and it becomes equivalent to the configuration shown in FIG. 7, in a case where the switch SW5 has been turned ON. That is, according to the configuration shown in FIG. 8, the switching between the configuration shown in FIG. 4 and the configuration shown in FIG. 7 is permitted by the switch SW5. Therefore, in the case where it is expected that the DC offset of the preceding stage is comparatively large, so the input amplitude is small, the switch SW5 is turned OFF to bring the HPF 73 into the configuration equivalent to the HPF 71. Besides, in the case where it is expected that the DC offset of the preceding stage is comparatively small, so the input amplitude is large, the switch SW5 is turned ON to bring the HPF 73 into the configuration equivalent to the HPF 72. Depending upon the situation of the DC offset of the preceding stage or the situation of the signal as stated above, the HPF 73 is appropriately switched to the configuration of the HPF 71 in which the efficiency of the elimination of the DC component generated by the gain switching is high, and the HPF 72 in which the DC offset ascribable to the input amplitude at the cutoff frequency switching does not appear. Regarding the timing of the configurational switching, the magnitude of the input amplitude, for example, may well be judged by receiving a gain setting end signal from another IC. The configuration of the HPF 73 may well be appropriately changed into that of the HPF 71 or the HPF 72 by providing a certain gain setting value as a threshold value or the like, in accordance with the gain setting of the PGA or the LNA on the basis of a signal or the like from the control logic unit 10.

Owing to the above configuration, the high-speed gain switching and the elimination of the DC offset can be performed even in the radio communication system of short gain setting period such as the radio LAN. Besides, the HPF configuration is appropriately changed depending upon the magnitude or the like of the input amplitude or the DC offset, whereby the DC offset can be eliminated more reliably, and a good receiving apparatus can be provided.

By the way, in the embodiment of the invention, the HPF configuration has been switched by the signal for detecting the magnitude or the like of the input amplitude or the DC offset, but the configuration may well be switched in a certain time by employing a timer.

<Embodiment 4>

Figure 9:
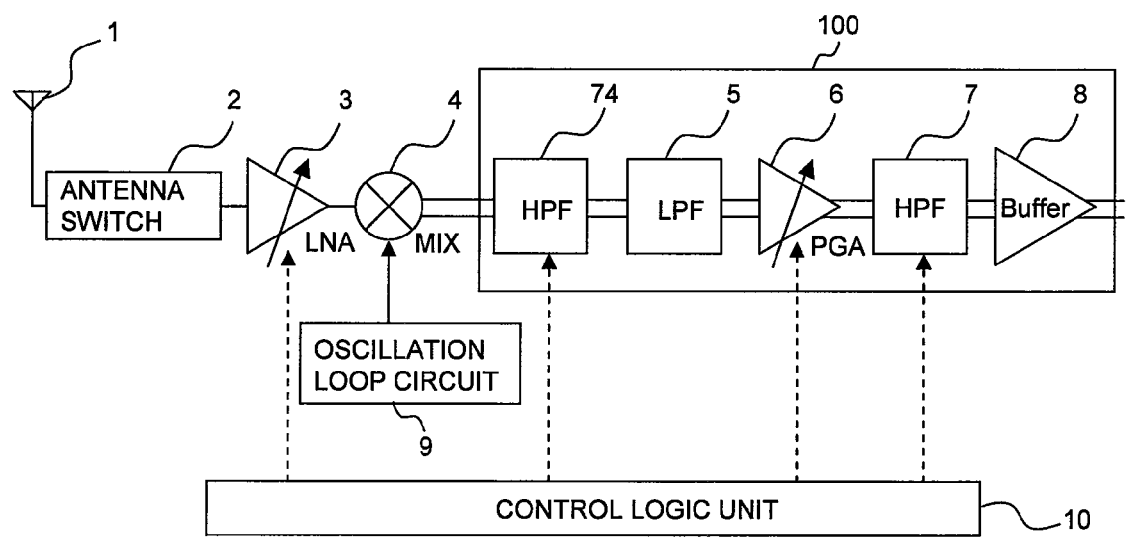
FIG. 9 is a block diagram of another configurational example of a receiving apparatus according to the invention.

Another configurational example of a receiving apparatus according to the invention is shown in FIG. 9. The receiving apparatus 200 shown in FIG. 9 is greatly different from the receiving apparatus shown in FIG. 1, in that an HPF 74 is disposed at a stage prior to the LPF 5. Incidentally, the LNA 3 is configured so that its gain can be switched under the control of the control logic unit 10.

In each of Embodiments 1 to 3, the DC offset is multiplied by a gain by the PGA 6. Therefore, in a case where the DC offset which appears at the gain switching of the LNA 3 or due to the flicker noise or self-mixing of the mixer 4 or the like is somewhat large, the saturation of an amplifier constituting the PGA 6 is apprehended.

In the configuration shown in FIG. 9, therefore, the HPF 74 is disposed at the stage prior to the LPF 5. The configuration of the HPF 74 is basically the same as that of the HPF 7. Besides, the charging time of the HPF 74 at the prior stage with respect to an input is set earlier than the charging time of the HPF 7 at a posterior stage, and a timing at which the cutoff frequency of the HPF 74 at the prior stage is switched is made earlier than a timing at which the cutoff frequency of the HPF 7 at the posterior stage is switched.

The RF signal received by the antenna 1 is distributed to the reception portion by the antenna switch 2, and is amplified by the LNA 3 whose gain is switchable. Thereafter, the RF signal and the local frequency of the oscillation loop circuit 9 are multiplied by the mixer 4, whereby the RF signal is directly downconverted into the baseband frequency bandwidth. The baseband signal has DC offsets ascribable to the LNA 3, the mixer 4, etc. eliminated in the HPF 74, and has the signal of the neighboring channel eliminated by the LPF 5. Then, the baseband signal has a gain set by the PGA 6 so as to become a desired level, the HPF 7 eliminates the DC offset and flicker noise which appear at the gain switching, and the baseband signal is outputted through the buffer 8.

The configuration shown in FIG. 4 is adopted as each of the HPFs 74 and 7 in this embodiment, and a time constant concerning the charging of the HPF 74 at the stage posterior to the mixer 4 is set smaller than a time constant concerning the charging of the HPF 7 at the stage posterior to the PGA 6. When the time constant concerning the charging is small, the DC offset dependent upon the input amplitude increases at the cutoff frequency switching in the charging of the second capacitor C2, but the operating speed of the filter can be heightened, and the charging of the capacitor C2 becomes earlier. Concretely, the time constants concerning the charging operations of the HPFs 74 and 7 are determined by the values of the capacitors C2X and C2Y and the resistances R2X and R2Y. The filter at the prior stage has the charging time constant made smaller by adjusting the values of the capacitors C2X and C2Y and the resistances R2X and R2Y.

Figure 10:
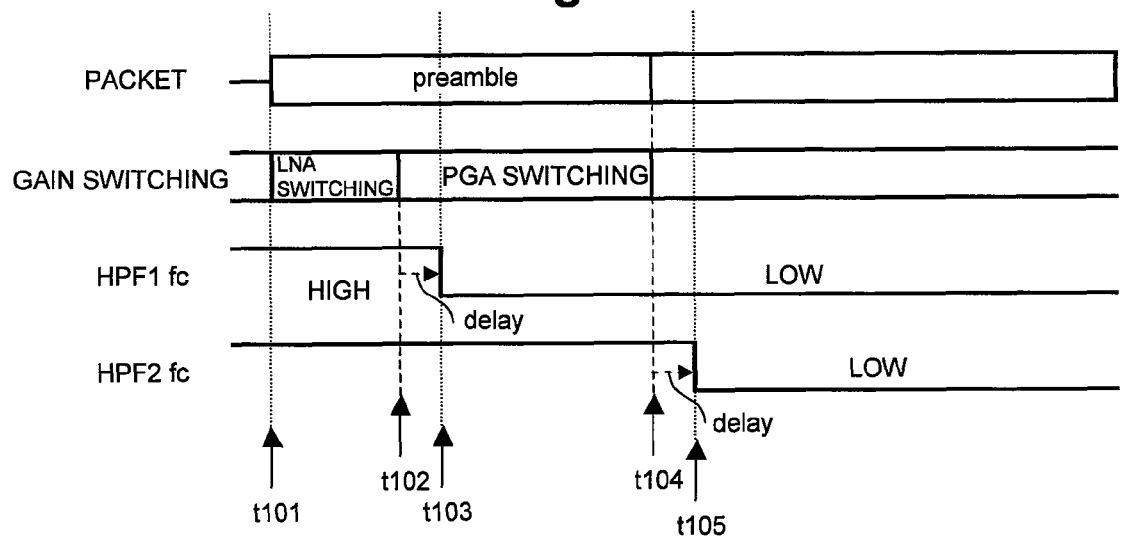
FIG. 10 is a time chart of the cutoff frequency switching of an HPF which is included in the receiving apparatus shown in FIG. 9.

A time chart of the cutoff frequency switching is shown in FIG. 10.

In a packet having a preamble period (time t101 to time t104), the gains of the LNA 3 and the PGA 6 are set. At the time t101, the cutoff frequencies of the HPFs 74 and 7 have been set high, the gain setting of the LNA 3 is started, and the capacitors C2 of the HPFs 74 and 7 are charged. The gain setting of the LNA 3 is ended at a time t102, and the cutoff frequency of the HPF 74 is lowered at a time t103 in the delay of the time t102 to the time t103. Here, since the HPF 74 is smaller than the HPF 7 in the time constant, the charging operations of the capacitors C2X and C2Y become earlier, and an operation of higher speed is performed. Subsequently, the PGA gain setting is ended at the time t104, and the cutoff frequency of the HPF 7 is lowered at a time t105 in the delay of the time t104 to the time t105.

Besides, the timings at which the cutoff frequencies of the individual HPFs are switched are provided with the delays of the period of the time t102 to the time t103 and the period of the time t104 to the time t105 from the respective gain setting completion times. Each of the delays serves to ensure a time period in which a DC offset appearing due to the gain switching settles, and it should be as short as possible. However, it needs to be appropriately adjusted in accordance with the switching timing, an amplitude, the frequency, and the time constant concerning the charging. In a case, for example, where the DC offset does not change at the gain switching of the LNA 3, the delay of the time t102 to the time t103 can be made null or shortened.

In addition, when the time constant concerning the charging is set small, errors corresponding to input amplitudes appear in the charging quantities of the capacitors C2X and C2Y, and the DC offsets attendant upon the cutoff frequency switchings become large. However, in case of a communication system in which a certain amplitude is prevented from being exceeded, by the gain setting method of the LNA 3, the dependency of the input amplitude becomes comparatively small, and the setting becomes especially effective.

Owing to the above configuration, the DC offsets which are generated in the LNA 3, the mixer 4, etc. and which are inputted to the PGA 6 are eliminated by the HPF 74 of quick response, and the DC offset which is amplified and generated in the PGA 6 is eliminated by the HPF 7. Moreover, even in a case where large DC offsets exist in the LNA 3, the mixer 4, etc., the possibility of the saturation of the PGA 6 decreases, and the elimination of the DC offsets is permitted.

Incidentally, as the end timing of the gain setting of the LNA 3 at the time t102, a gain setting end signal may be obtained from an external control IC which performs the controls of transmission and reception, the gain setting, etc., so as to set the cutoff frequency of the HPF 74 low with the certain delay from the gain setting end signal. Alternatively, the setting end may well be judged by the control logic unit 10.

By the way, the two HPFs have been disposed in the embodiment of the invention. However, this aspect is not restrictive, but three or more HPFs may well be disposed in such a manner that the time constants concerning the charging of the HPFs at stages preceding more are set smaller.

Incidentally, the configuration in FIG. 7 or FIG. 8 can be adopted as each of the HPFs 74 and 7 in the embodiment of the invention.

<Embodiment 5>

Figure 11:
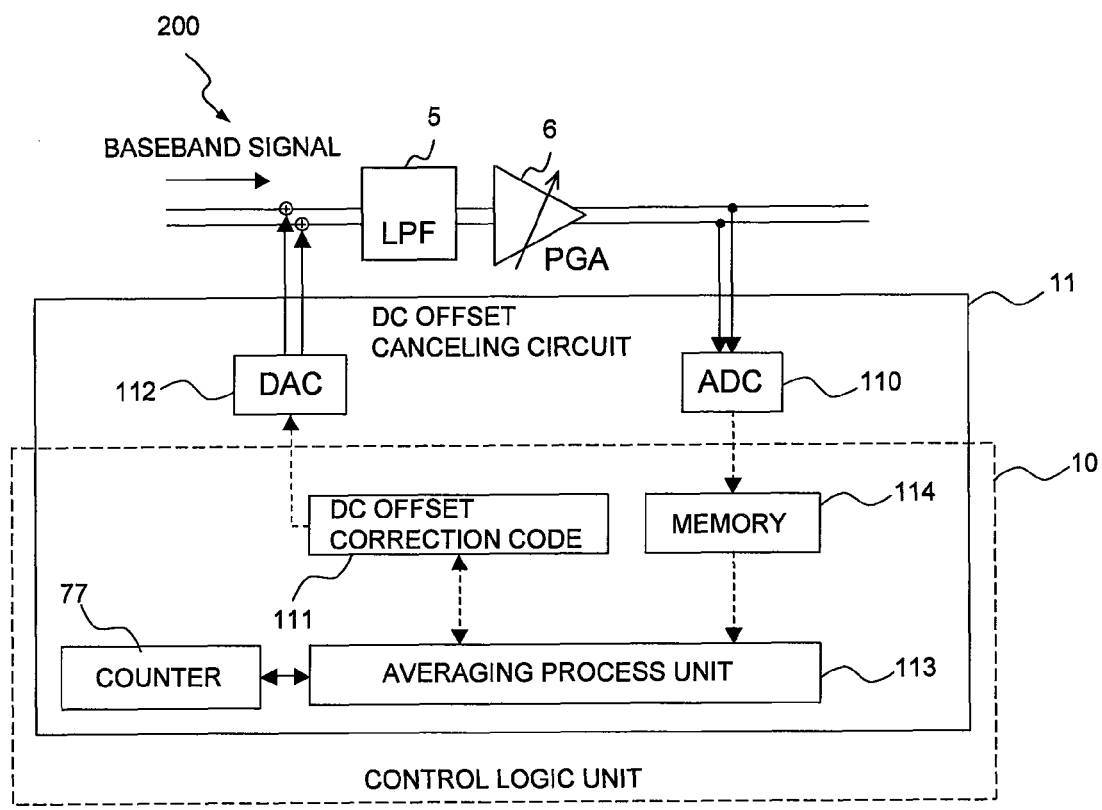
FIG. 11 is a block diagram of another configurational example of a principal portion in a receiving apparatus according to the invention.

Another configurational example of principal portions in a receiving apparatus according to the invention is shown in FIG. 11. The receiving apparatus 200 shown in FIG. 11 is greatly different from the receiving apparatus 200 shown in FIG. 1 or FIG. 9, in that a DC offset canceling circuit 11 for canceling a DC offset is disposed.

The DC offset canceling circuit 11 averages digital correction information items obtained over a plurality of times, thereby to enhance a DC offset correction precision. This DC offset canceling circuit 11 can adopt a DC offset canceling scheme in which the DC offset is detected by an ADC (Analog-to-Digital Converter) 110, thereby to acquire digital information having the information of a DC offset quantity, and the digital information is fed back by a DAC (Digital-to-Analog Converter) 112.

The DC offset canceling circuit 11 is configured including the ADC 110 for converting an analog signal into the digital information, the DAC 112 for converting the digital information into an analog signal, a memory 114 for storing the digital output of the ADC 110 therein, a DC offset correction code register 111 for retaining therein a DC offset correction code which is the digital information for a DC offset correction, a counter 77 for counting the number of times of averaging, and an averaging process unit 113. The counter 77, the DC offset correction code register 111, the averaging process unit 113 and the memory 114 are arranged in the control logic unit 10.

The output signals of the PGA 6 are conveyed to the ADC 110. The ADC 110 outputs the digital information expressive of the DC offset quantity. The output of the ADC 110 is stored in the memory 114, the averaging process unit 113 averages the digital information items within the memory 114 and the codes within the DC offset correction code register 111, and the number of times of averaging is counted by the counter 77.

The averaged information is written into the DC offset code register 111 as a new DC offset code. The output signals of the DAC 112 are added to a baseband signal on the input side of the LPF 5, whereby a correction is made.

Figure 12:
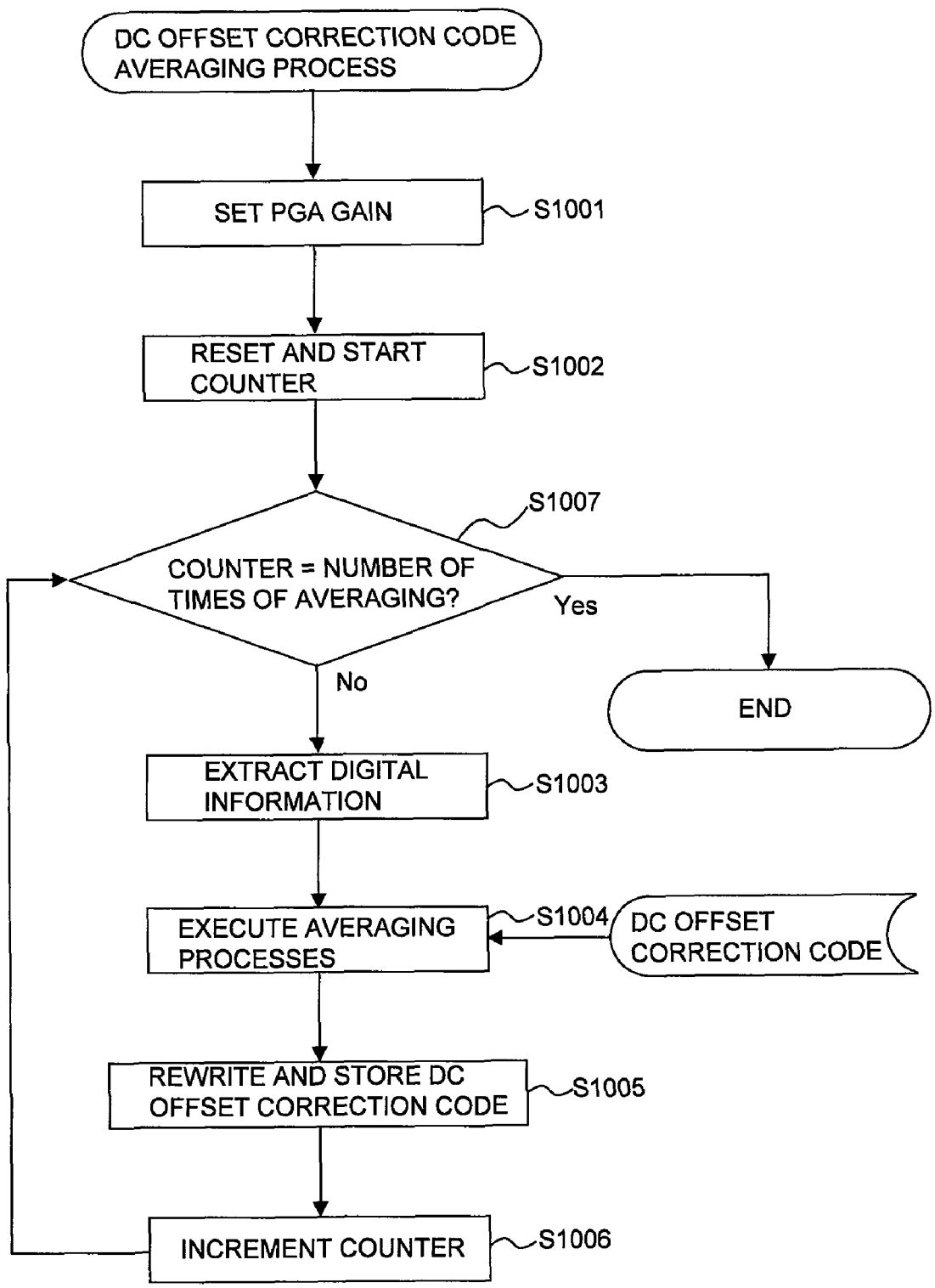
FIG. 12 is a flow chart of a DC offset correction code averaging process which is executed by an averaging process unit shown in FIG. 11.

A flow chart concerning the DC offset correction code averaging process (hereinbelow, termed the "calibration") which is executed in the averaging process unit 113 is shown in FIG. 12.

Initially, the control logic unit 10 sets a gain (S1001), and it resets and starts the counter 77 (S1002). If the counter 77 does not reach a desired number of times of averaging (S1007), the digital output of the ADC 110 is stored in the memory 114 (S1003). The averaging process unit 113 averages the digital outputs of the ADC 110 as are stored in the memory 114, and the DC offset correction codes 111 (S1004). The control logic unit 10 stores the averaged DC offset correction code 111 (S1005). Subsequently, the counter 77 is incremented by "1" (S1006). Such steps are repeated until the counter 77 reaches the number of times of the averaging process (S1007). When the counter 77 has reached the number of times of the averaging process, the calibration is ended.

The control logic unit 10 performs the calibrations at the respective gains, and it finally stores the averaged DC offset correction code 111. During the gain setting mode, the DC offset correction code 111 corresponding to the gain setting as obtained every gain setting is read out, and this DC offset correction code 111 is changed into the analog signal by the DAC of the DC offset canceling circuit 11, whereby the correction is made.

Figure 13:
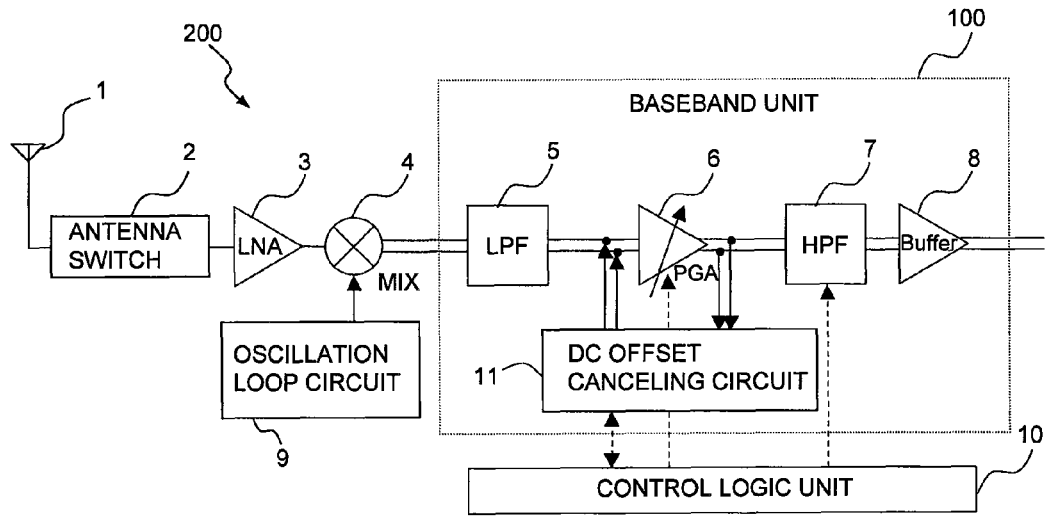
FIG. 13 is a block diagram of another configurational example of a receiving apparatus according to the invention.

A configurational example in the case where the DC offset canceling circuit 11 is disposed in the receiving apparatus 200 shown in FIG. 1 is depicted in FIG. 13.

Here, the DC offset canceling circuit 11 is connected to the input side and output side of the PGA 6, so as to acquire the DC offset correction codes at the respective gains beforehand. During the gain setting mode, the DC offset correction codes acquired by the calibrations are added to the baseband signals on the input side of the PGA 6, thereby to make the corrections of eliminating the DC offsets.

Owing to the above configuration, the DC offsets in the PGA 6 are decreased by the DC offset canceling circuit 11, and the DC offset elimination based on the HPF 7 is performed, so that a more favorable characteristic can be obtained.

Incidentally, the number of times of the averaging has been set at the fixed set number of times, but the averaging may well be performed until a precision is attained. By way of example, the averaging may well be ended when the fluctuation of the DC offset correction code has become one bit or less.

By the way, the inputs and outputs of the DC offset canceling circuit in this embodiment have been respectively set as the outputs of the PGA 6 and the inputs thereof. However, this is not restrictive, but the outputs of the PGA 6 may well be connected to the inputs of the DC offset canceling circuit, and the outputs of the DC offset canceling circuit to the inputs or the likes of the LPF 5.

Also, the time when the power source of the receiving apparatus is ON and when any signal is not inputted is considered as the period of the calibration, and this period of the calibration may well be, for example, an initial operation period at the turn-ON of the power source of the receiving apparatus.

<Embodiment 6>

Figure 14:
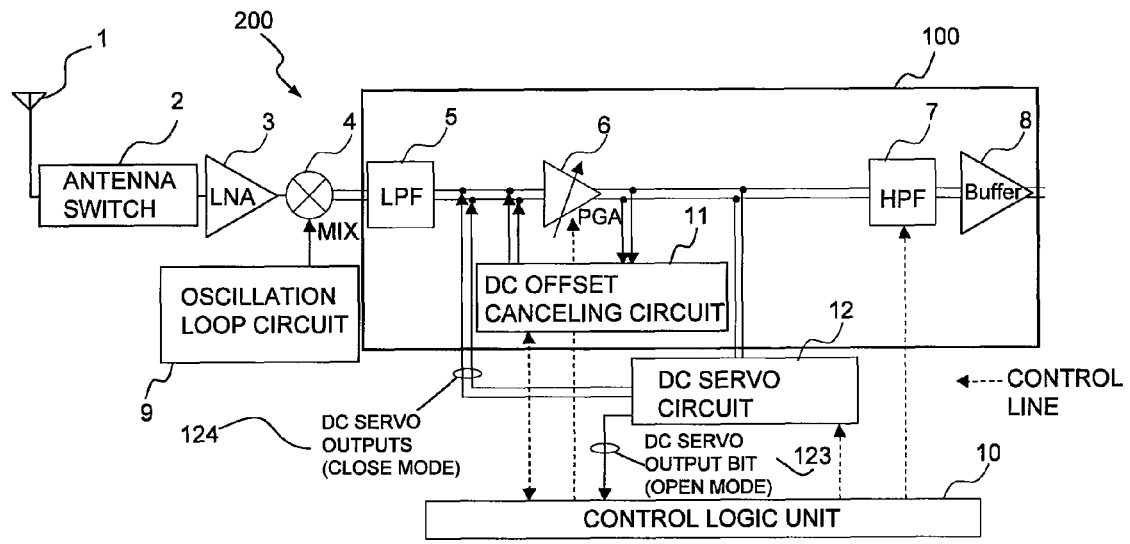
FIG. 14 is a block diagram of another configurational example of a receiving apparatus according to the invention.

Another configurational example of a receiving apparatus according to the invention is shown in FIG. 14. The receiving apparatus 200 shown in FIG. 14 is greatly different from the receiving apparatus shown in FIG. 13, in that a DC servo circuit 12 is disposed.

Embodiment 5 stated above has indicated the receiving apparatus which employs the DC offset canceling circuit 11, and in which the digital correction value of the DC offset is acquired every gain setting, so as to make the correction. However, in a case where a DC offset which fluctuates temporally gradually, such as a temperature change, is existent, the DC offset itself or the correction magnitude of the DC offset canceling circuit 11 becomes different between at the calibration and in the ordinary operation. By way of example, the DC offset correction code 111 is acquired at a certain temperature "temp1" at the calibration, and the correction is made with the DC offset correction code 111 at a different temperature "temp2" from that at the calibration in the ordinary operation. Then, discrepancies based on the temperatures occur in the resolution of the ADC 110, the correction magnitude of the DAC 111, etc., and accurate corrections might be impossible. As shown in FIG. 14, therefore, corrections are reinforced by adding the DC servo circuit 12 which has the two sorts of correction means of an analog loop feedback and a digital loop feedback on the basis of the output signals of the PGA 6.

The DC servo circuit 12 includes the first correction means for making the corrections by the analog loop feedback which acts directly on the baseband signal, and the second correction means for making the corrections by the feedback to the DC offset correction code 111 of the DC offset canceling circuit 11. The corrections based on these feedback loops become effective especially in the case of eliminating the gradual DC offset attendant upon the temperature change or the like.

Figure 15:
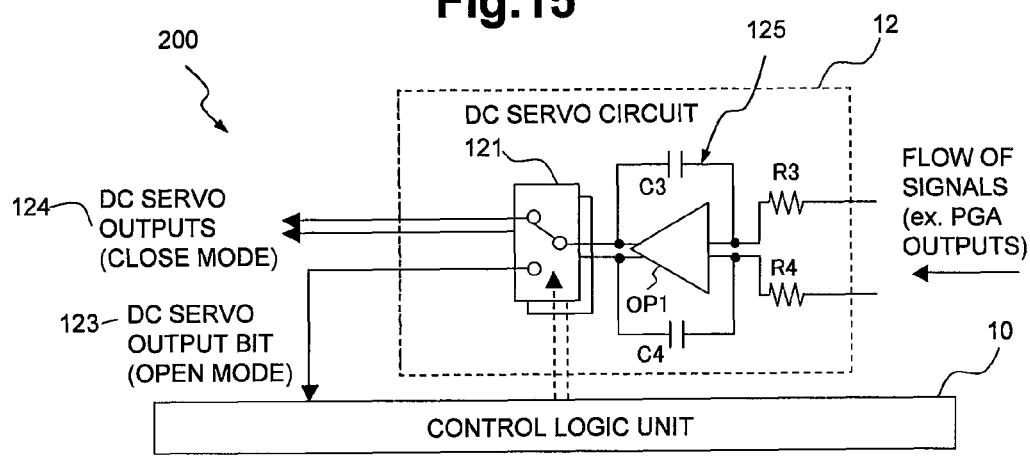
FIG. 15 is a circuit diagram of a configurational example of a DC servo circuit in FIG. 14.

A configurational example of the DC servo circuit 12 is shown in FIG. 15.

The DC servo circuit 12 includes an integration circuit 125 for integrating the output signals of the PGA 6, and a switch 121 for distributing the output signals of the integration circuit 125. A known circuit which is configured including resistances R3 and R4, an operational amplifier OP1, and capacitors C3 and C4 can be applied as the integration circuit 125. The outputs of the DC servo circuit 12 have the mode (hereinbelow, called the "close mode") in which the DC offset correction magnitudes are directly fed back to the baseband signals in analog fashion, and the mode (hereinbelow, called the "open mode") in which the DC offset correction magnitudes are fed back to the DC offset correction code register 111 within the control logic unit 10 in digital fashion.

The control logic unit 10 performs the calibration every gain setting by the DC offset canceling circuit 11, so as to acquire a code in the DC offset correction code register 111 corresponding to each gain setting. At the gain setting, the correction is made by invoking the code in the DC offset correction code register 111 as corresponds to the gain setting. The integrator 125 of large time constant is employed for the DC servo circuit 12 in order to follow up the DC offset which fluctuates temporally gradually. In case of intermittent receptions as in a radio LAN, however, intermittent operations in which transmission and reception units are turned ON and OFF every switching of transmission and reception are performed in order to attain low consumption power. Therefore, with the conventional method (close mode) in which the correction magnitudes are directly brought back to the baseband signals, an accurate DC offset correction might be impossible on account of an insufficient time period for the correction. From such a viewpoint, the DC servo circuit 120 has the two correction modes of the open mode in which the differential output of the PGA 6 is delivered through the integrator, so as to digitally correct the DC offset correction code 111 of the DC offset canceling circuit 11, and the close mode in which the outputs of the integrator are directly fed back to the baseband signals.

The operation of the above configuration will be described.

Here, the operations in which the circuits are turned ON and OFF in accordance with the transmission and the reception shall be called the "intermittent operations", while an operation in which the circuit is always held ON during a communication or which handles a comparatively long packet shall be called the "continuous operation".

The differential baseband signals outputted from the PGA 6 or the like are inputted to the DC servo circuit 120 which follows up the DC offset fluctuating gradually, and the open mode which outputs the digital correction signal 123 of the DC servo circuit 120 and the close mode which outputs the analog correction signals 124 are switched by the mode switch 121. The integrator 125 needs to have its time constant enlarged for the purpose of following up the gradual DC offset, and a large element is employed for the configuration of the integrator 125. The outputs of the DC servo circuit 120 are switched by the mode switch 121, and in the open mode, the DC servo output bit 123 is obtained from one of the differential outputs of the integrator 125. In the close mode, the outputs of the integrator are directly fed back to the baseband signals as the DC servo outputs 124. The control logic unit 10 performs the control of the mode switch 121, and the extraction, reflection etc. of the DC servo output bit 123.

First, the close mode will be described.

With the start of a packet, the power source is turned ON, the outputs of the integrator of the DC servo circuit 12 fluctuate following up the DC offset, and they are directly brought back to the baseband signals. In this case, while the power source is ON, the integrator outputs follow up the DC offset, and the influence of the gradual DC offset can be eliminated, so that this mode becomes effective for the system of the continuous operation. In the intermittent operation of short packet, the power source is turned OFF before the integrator outputs follow up the DC offset, and an accurate correction might not be made.

Next, the open mode will be described.

Figure 16:
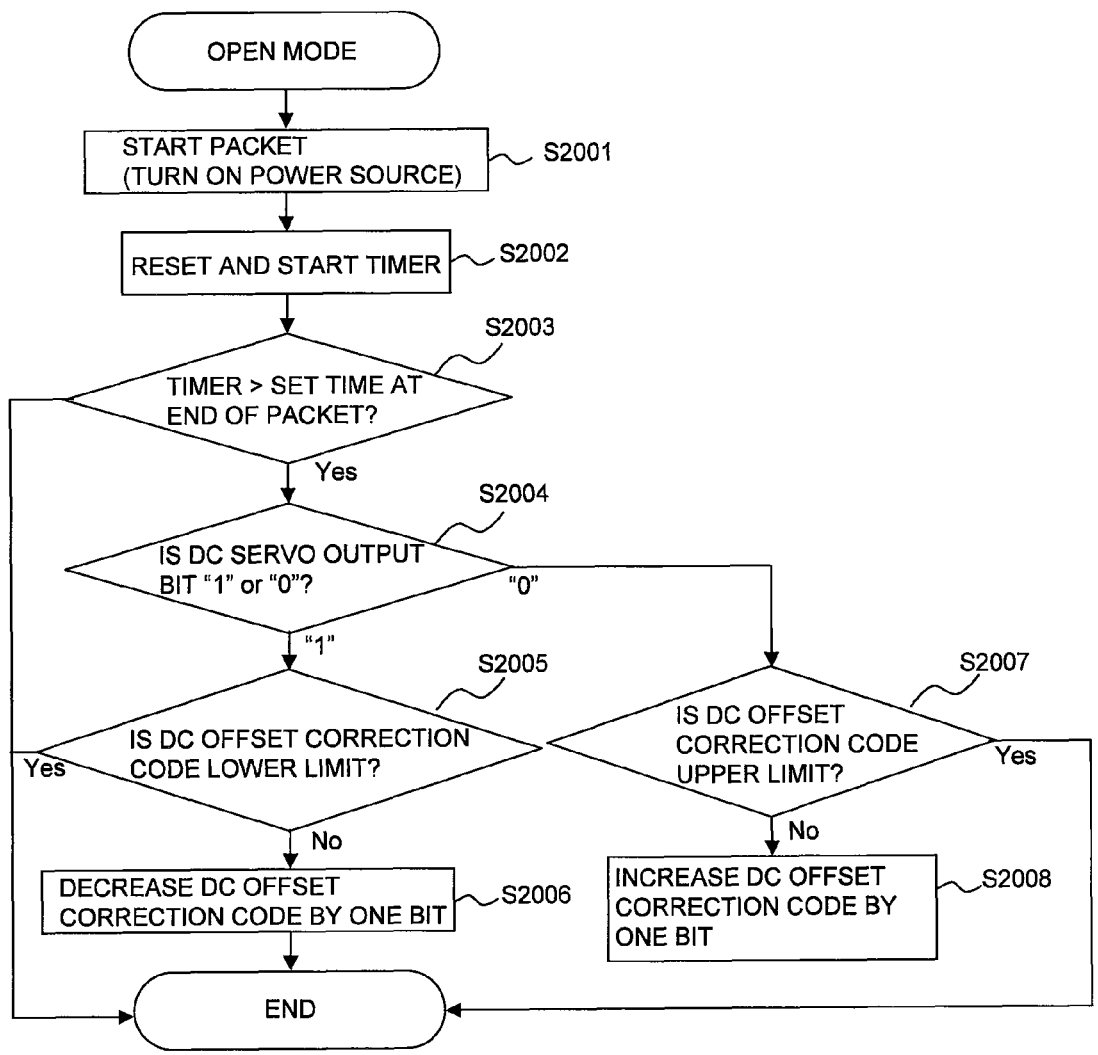
FIG. 16 is a flow chart of an open mode in the receiving apparatus shown in FIG. 14.

A flow chart concerning the open mode is shown in FIG. 16.

The power source is turned ON (S2001), and the control logic unit 10 resets and starts a timer (S2002). In a case where the timer has become, at least, a set time (for example, several hundred μsec) at the end of the packet, the control logic unit 10 acquires the DC servo output bit 123 at or before the packet end (S2003).

It is assumed here that, in a case where the DC offset has appeared to be plus with respect to a reference voltage, the DC servo output bit 123 is outputted as "1", whereupon the correction is made so as to properly decrease the DC offset, by lowering the bit of the DC offset correction code 111. On the other hand, it is assumed that, in a case where the DC offset has appeared to be minus with respect to the reference voltage, the DC servo output bit 123 is outputted as a logic value "0", whereupon the correction is made so as to properly decrease the DC offset, by raising the bit of the DC offset correction code 111. In the case where the DC servo output bit 123 is the logic value "1" (S2004), the control logic unit 10 judges if the DC offset correction code 111 of the DC offset canceling circuit 11 is a lower limit (S2005). When the DC offset correction code 111 is the lower limit, the routine is ended, and when not, the DC offset correction code 111 is decreased by one bit (S2006).

On the other hand, in the case where the DC servo output bit 123 is the logic value "0" (S2004), the control logic unit 10 judges if the DC offset correction code 111 of the DC offset canceling circuit 11 is an upper limit (S2007). When the DC offset correction code 111 is the upper limit, the routine is ended, and when not, the DC offset correction code 111 is increased by one bit (S2008). In a case where the timer indicates, at most, the set time at the end of the packet (S2003), the control logic unit 10 does not acquire the DC servo output bit 123, and it neither increases nor decreases the DC offset correction code 111 of the DC offset canceling circuit 11, thereby to avoid the correction of the indefinite DC offset correction code 111 ascribable to an instantaneous error or the like.

Owing to the above configuration, the close mode in which the correction is made by directly feeding the analog signals back to the baseband signals is employed for the continuous operation, and the open mode in which the DC offset correction code 111 of the DC offset canceling circuit 11 can be corrected at the precision of the +/−1 bit of the optimum value is employed for the intermittent operation. That is, it is permitted to correct the DC offset which fluctuates gradually with the temperature change or the like, without regard to the continuous operation and the intermittent operation.

By the way, in the open mode, the DC offset correction code 111 of the DC offset canceling circuit 11 has been increased or decreased, thereby to adjust the correction magnitude. However, this is not restrictive, but the adjustment of the correction magnitude may well be made in accordance with the configuration of the DAC 112 by making, for example, the correction based on the adjustment of a reference voltage, for the DAC employing a voltage source or the correction based on the adjustment of a reference current, for the DAC employing a current source.

In the open mode in the embodiment of the invention, the DC servo output bit 123 has obtained the bit of "1" or "0" as one of the differential outputs of the integrator within the DC servo circuit 120. It is also allowed, however, to adopt a configuration in which a precision is enhanced more by obtaining the DC servo output bits 123 from both the differential outputs of the integrator within the DC servo circuit 120.

In the open mode in the embodiment of the invention, the DC offset correction code 111 has been increased or decreased by one bit. However, this is not restrictive, but the correction magnitude may well be appropriately changed to 2 bits or 3 bits in accordance with a time period for which the output of the integrator within the DC servo circuit 120 appears, etc.

Besides, in the open mode in the embodiment of the invention, the timing for obtaining the DC servo output bit 123 has been set at the end of the packet, but it is also allowed to employ an aspect in which the end of the packet is reflected after a fixed time period.

It is especially effective to set the open mode in the embodiment of the invention, in the intermittent operation, and to set the close mode, in the continuous operation. However, this is not restrictive, but the invention is effective also in a system in which the intermittent operation and the continuous operation coexist in such a way that the modes are set in conformity with the RF signals beforehand, or that the control logic unit 10 sets the modes by judgments from the RF signals, etc.

<Embodiment 7>

Figure 17:
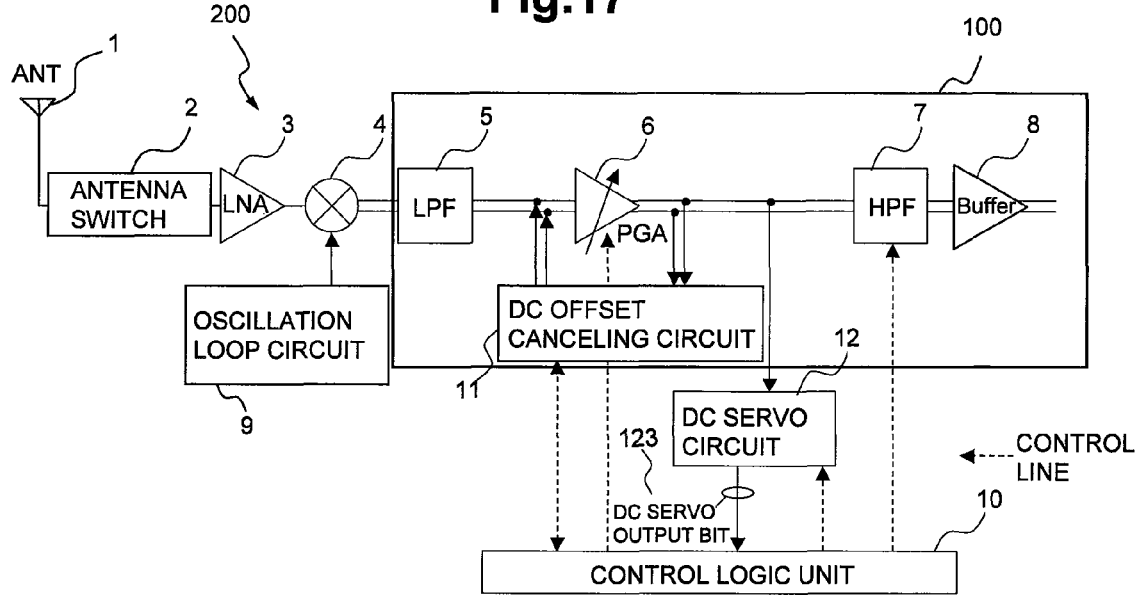
FIG. 17 is a block diagram of another configurational example of a receiving apparatus according to the invention.

Another configurational example of a receiving apparatus according to the invention is shown in FIG. 17. The receiving apparatus 200 shown in FIG. 17 is greatly different from the receiving apparatus 200 shown in FIG. 14, in that the DC servo circuit 12 is simplified.

In the sixth embodiment stated before, the DC servo circuit 12 has had the two modes of the close mode of the analog feedback and the open mode of the digital feedback. Since, however, the element for use as the integrator within the DC servo circuit 12 needs to enlarge its time constant, it becomes large and is disadvantageous for reduction in size. In the configuration shown in FIG. 17, therefore, the whole configuration is the same as in Embodiment 6, and the input of the DC servo circuit 12 is set as one of the differential baseband signals, while the output of the DC servo circuit 12 is corrected in the open mode irrespective of the intermittent operation and the continuous operation.

Figure 18:
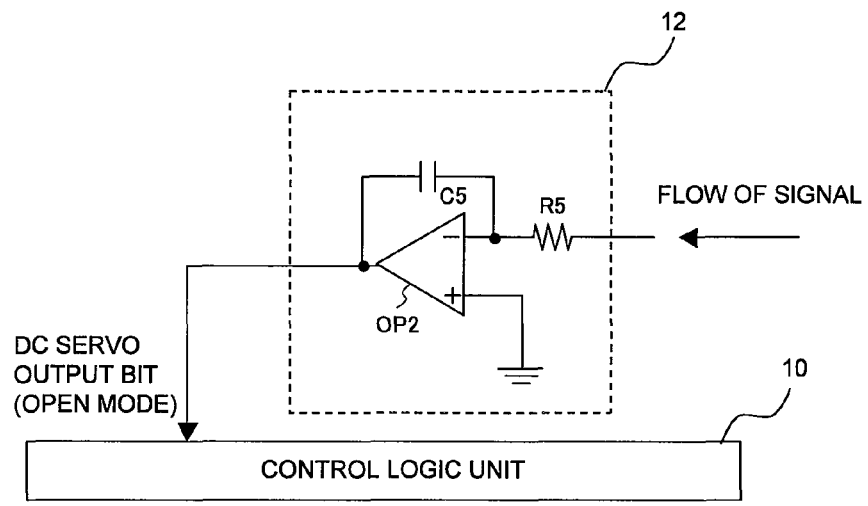
FIG. 18 is a circuit diagram of a configurational example of a DC servo circuit in FIG. 17.

A configurational example of the DC servo circuit 12 in FIG. 17 is shown in FIG. 18.

An input to the DC servo circuit 12 is one of the differential baseband signals, and the output of the DC servo circuit 12 is connected to the control logic unit 10. Since each of the input/output to/from the DC servo circuit 12 becomes one path, the DC servo circuit 12 becomes only an integrator configured of a resistance R5, an operational amplifier OP2 and a capacitor C5, as shown in FIG. 18. In this case, the number of constituents becomes smaller than in the case shown in FIG. 15, and hence, reduction in size is attained.

Figure 19:
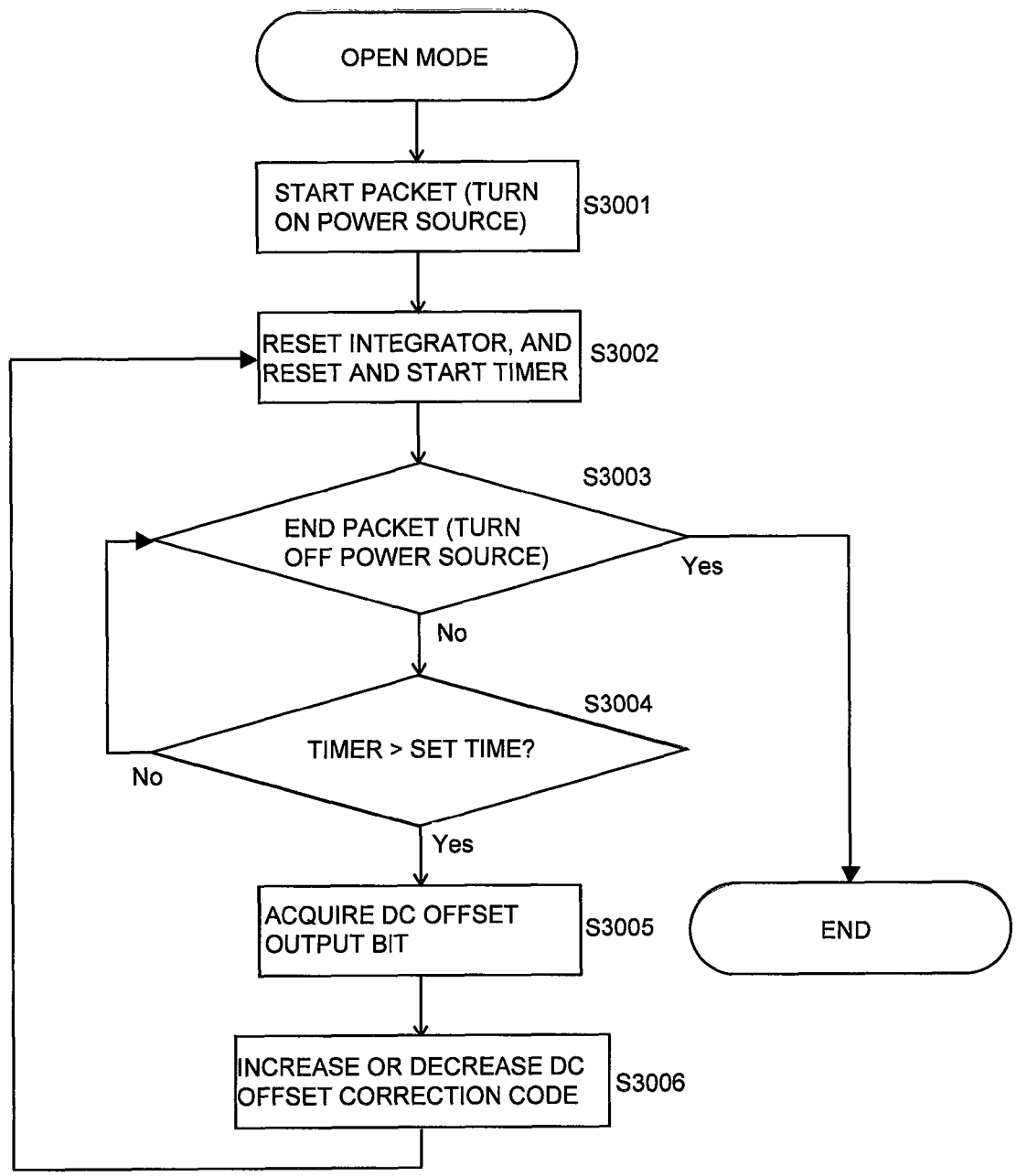
FIG. 19 is a flow chart of the operation of the receiving apparatus shown in FIG. 17.

A flow chart concerning the operation of the receiving apparatus 200 shown in FIG. 17 is shown in FIG. 19.

In case of the intermittent operation, the same operation as in the open mode of Embodiment 6 is performed, and it shall therefore be omitted from description.

In case of the continuous operation, the power source is turned ON at the start of a packet (S3001). The control logic unit 10 resets the integrator within the DC servo circuit 12, and it resets and starts its timer (S3002). When, unlike the turn-OFF of the power source attendant upon the end of the packet (S3003), the timer has become a set time (S3004), the control logic unit 10 acquires the DC servo output bit 123 (S3005). The control logic unit 10 reflects the acquired DC servo output bit 123 upon the DC offset correction code 111 (S3006). Thereafter, the control logic unit 10 resets the integrator within the DC servo circuit 12 again, and it resets and starts its timer (S3002). The above operation is repeated as long as the power source is ON, and it is ended in a case where the power source has turned OFF.

Owing to the above configuration, while the operation is continuing, the DC offset correction code 111 is corrected every set time period, and the series of corrections are ended when the power source has turned OFF with the end of the intermittent operation at the end of the packet, or the like, whereby the modes of the feedback correction need not be switched in the intermittent operation and the continuous operation, and a gradual DC offset is coped with and can be eliminated. Moreover, only the open mode is set, whereby the number of constituents in the DC servo circuit 12 is decreased, and this is effective for making the area of the DC servo circuit 12 smaller.

<Embodiment 8>

Figure 20:
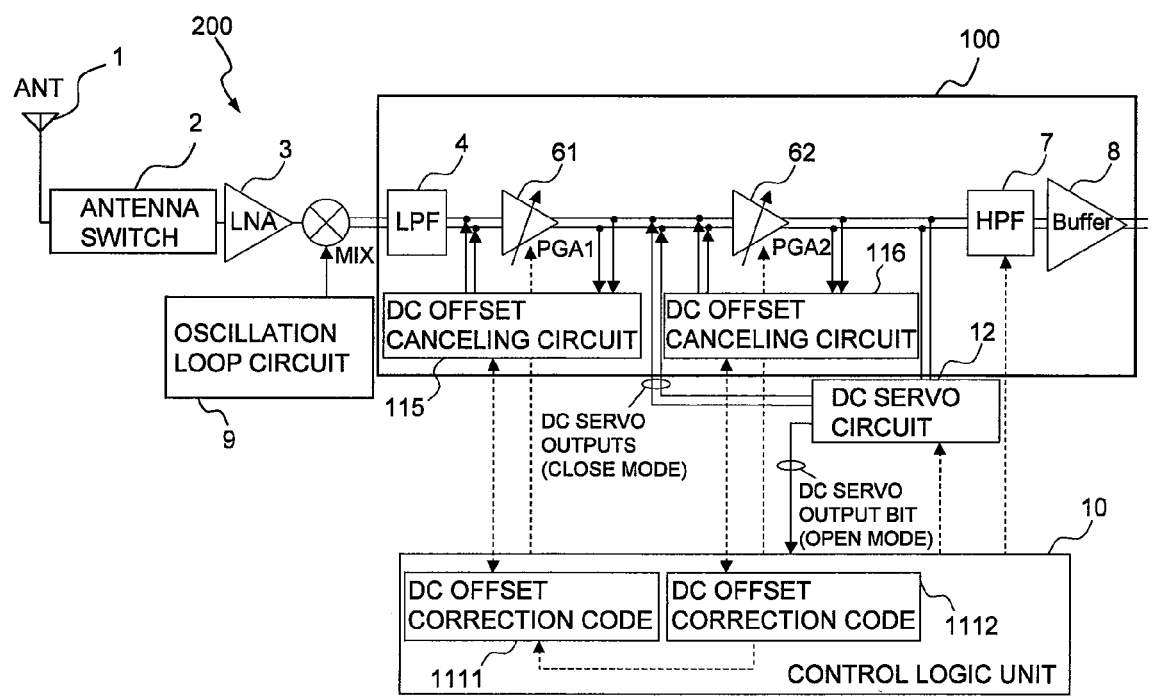
FIG. 20 is a block diagram of another configurational example of a receiving apparatus according to the invention.

Another configurational example of a receiving apparatus according to the invention is shown in FIG. 20. The receiving apparatus 200 shown in FIG. 20 is greatly different from the receiving apparatus 200 shown in FIG. 14, in that PGAs 61 and 62 and DC offset canceling circuits 115 and 116 corresponding thereto, respectively, are disposed.

In each of Embodiments 6 and 7 stated before, in a case where the DC offset correction code 111 has become the upper limit or the lower limit, it is apprehended that the correction by the DC servo circuit 12 will be impossible, so a correction range will be limited, and a larger DC offset will not be eliminable. In the receiving apparatus 200 shown in FIG. 20, therefore, the plurality of DC offset canceling circuits 115 and 116 are disposed so as to expand the correction range of the DC offset correction code by the DC servo circuit 12.

Figure 21:
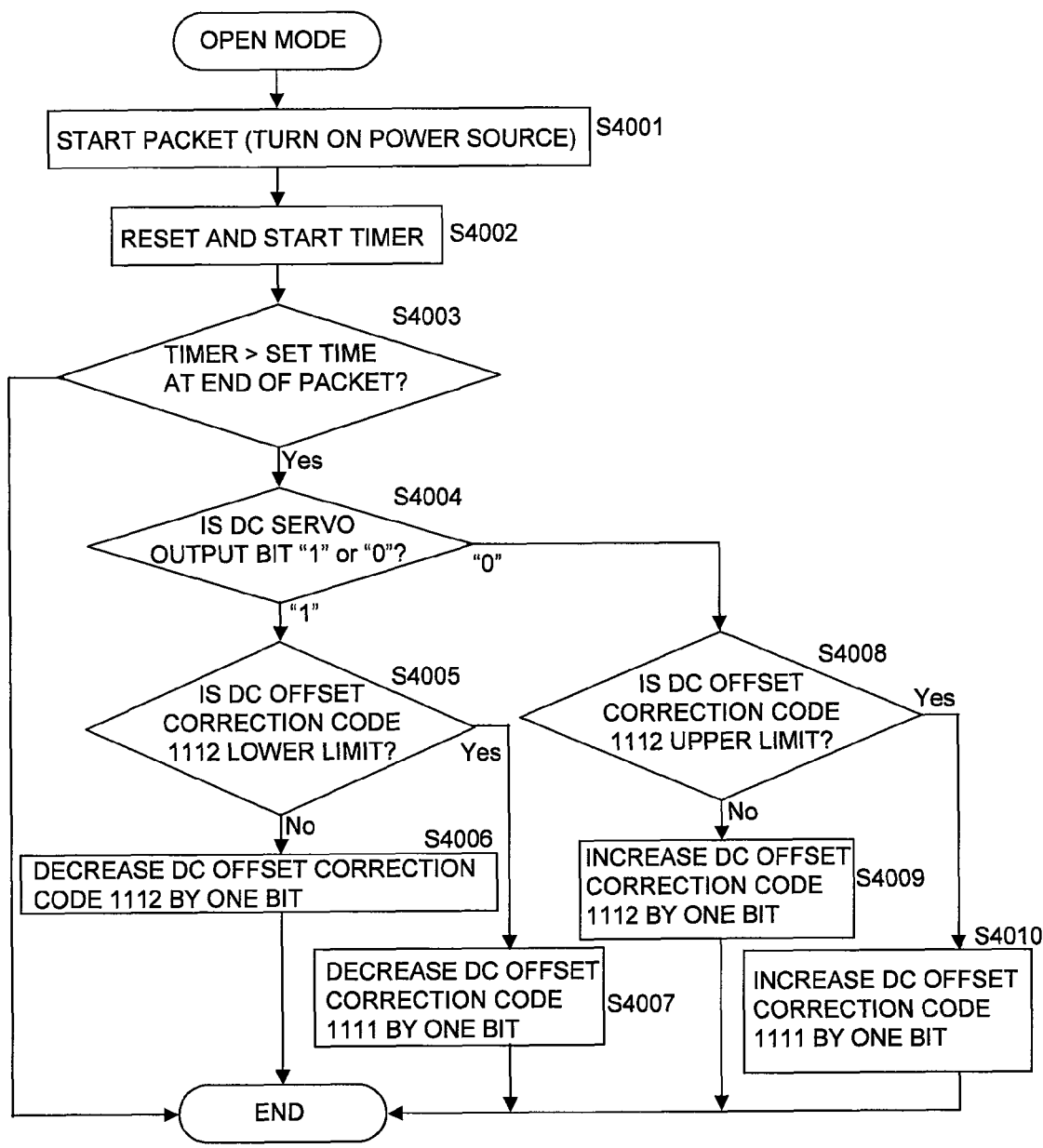
FIG. 21 is a flow chart of the operation of the receiving apparatus shown in FIG. 20.

A flow chart concerning the operation of the receiving apparatus 200 shown in FIG. 20 is depicted in FIG. 21.

Incidentally, a sequence till the acquisition of the DC servo output bit is the same as in the case of Embodiment 6, and hence, it shall be omitted from description.

The power source is turned ON (S4001), and the control logic unit 10 resets and starts its timer (S4002). In a case where the timer has become, at least, a set time at the end of a packet (S4003), the DC servo output bit 123 is acquired at the timing of the end of an intermittent operation (S4004). In a case where the DC servo output bit 123 is "1", the control logic unit 10 judges if the DC offset correction code 1112 of the DC offset canceling circuit 116 is the lower limit (S4005). When the DC offset correction code 1112 is adjustable, the control logic unit 10 decreases the DC offset correction code 1112 of the DC offset canceling circuit 115 by one bit (S4006).

When the DC offset correction code 1112 is the lower limit, the control logic unit 10 decreases the DC offset correction code 1111 of the DC offset canceling circuit 116 by one bit (S4007). On the other hand, in a case where the DC servo output bit 123 is "0", the control logic unit 10 judges if the DC offset correction code 1112 of the DC offset canceling circuit 116 is the upper limit (S4008). When the DC offset correction code 1112 is adjustable, the control logic unit 10 increases the DC offset correction code 1112 of the DC offset canceling circuit 115 by one bit (S4009). When the DC offset correction code 1112 is the upper limit, the control logic unit 10 increases the DC offset correction code 1111 of the DC offset canceling circuit 116 by one bit (S4010).

Owing to the above configuration, in the case where the DC offset correction code 1112 of the DC offset canceling circuit 116 as is initially corrected by the DC servo circuit 12 is the upper limit or lower limit, a signal for increasing or decreasing the DC offset correction code 1111 is transmitted to the DC offset canceling circuit 115 which is further annexed to the PGA 61 of the preceding stage. In a case, for example, where a DC offset of +0.5 mV exists at the input, DC offsets of +5 mV and +50 mV appear at the output of the PGA 61 and the output of the PGA 62 under the condition that the PGA 61 and PGA 62 have gains of 10 times and 10 times, respectively. Here, assuming that the correction ranges of the respective DC offset canceling circuits 115 and 116 are +/−10 mV, the correction code is corrected to the lower limit of −10 mV by the DC offset canceling circuit 116 concerning the PGA 62, and the DC offset becomes +40 mV and cannot be entirely corrected. In the DC offset canceling circuit 115 concerning the PGA 61, however, the DC offset lies within the correction range of +5 mV and +/−10 mV. That is, in the case where the DC offset correction code 1112 of the DC offset canceling circuit 116 of the PGA 62 at the succeeding stage cannot be entirely corrected due to the upper limit or the lower limit, the DC offset correction code 1111 of the DC offset canceling circuit 115 of the PGA 61 is increased or decreased, whereby the elimination of the large DC offset is permitted.

By the way, in Embodiment 8, it has been described that the DC servo circuit 12 is interposed between the inputs and outputs of the PGA 62. However, this is not restrictive, but it is also allowed to employ, for example, an aspect in which a DC servo is interposed between the inputs and outputs of the PGA 61, whereupon when the non-existence of a change in the DC servo output bit 123 or the DC servo outputs 124 has been detected, the DC offset correction code 1112 of the DC offset canceling circuit 116 is increased or decreased so as to make a fine adjustment.

This embodiment has adopted the two-stage configuration of the PGAs 61 and 62 and the DC offset canceling circuits 115 and 116. However, this is not restrictive, but it is also possible, for example, to dispose a plurality of stages of DC offset canceling circuits 11 and to expand a correction range still more.

In a case where the DC offset correction code 1112 has become the upper limit or the lower limit and where the DC offset correction code 1111 has been corrected by carrying up or down the DC servo output bit 123, this DC offset correction code 1112 having become the upper limit or the lower limit may well be reset. By way of example, it is considered to set the DC offset correction code 1112 so that the correction magnitude of the DC offset canceling circuit 116 may be set at an initial value or 0 V.

<embodiment 9>

Figure 22:
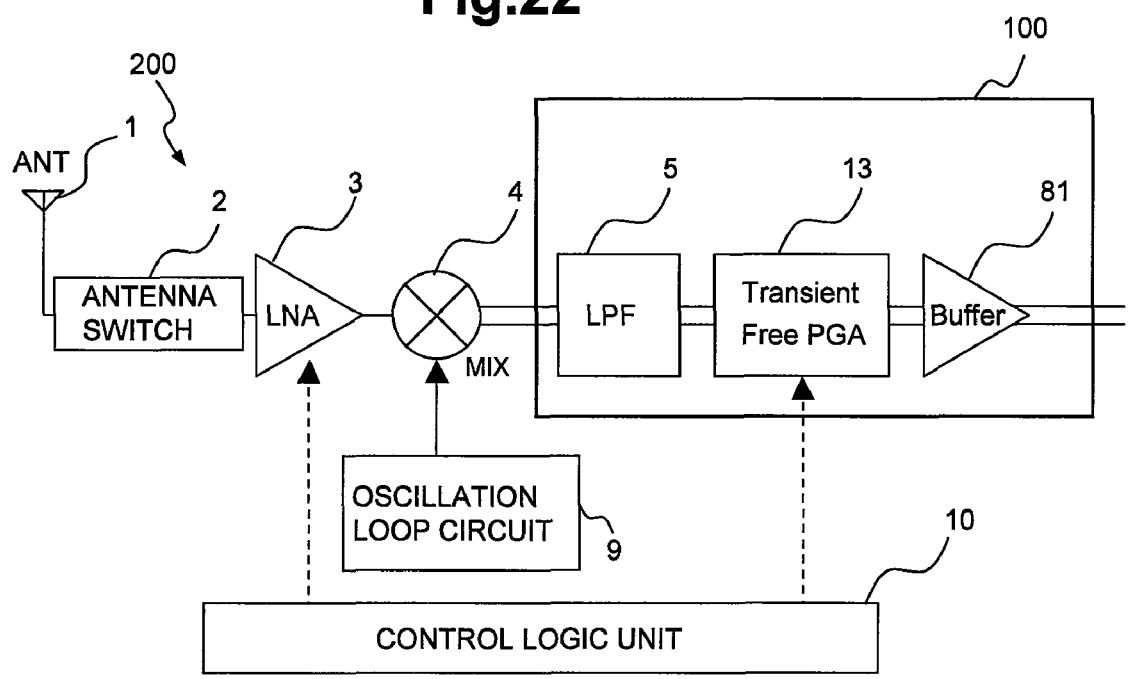
FIG. 22 is a block diagram of another configurational example of a receiving apparatus according to the invention.

Another configurational example of a receiving apparatus according to the invention is shown in FIG. 22. The receiving apparatus 200 shown in FIG. 22 is greatly different from the receiving apparatus 200 shown in FIG. 1, in that a transient free PGA 13 is disposed instead of the PGA 6 and the HPF 7. According to such a configuration, a gain can be varied without switching a cutoff frequency.

The RF signal received by the antenna 1 is distributed to the reception portion by the antenna switch 2, and it is amplified by the LNA 3 capable of switching the gain. The RF signal and the local frequency of the oscillation loop circuit 9 are multiplied by the mixer 4, whereby the RF signal is directly downconverted into the baseband frequency bandwidth. The downconverted baseband signal is amplified by the transient free PGA 13 having a gain switching function, and this baseband signal is outputted through a buffer 81 of high input impedance. The gain is varied by the transient free PGA 13, but the switching of the cutoff frequency is not performed at gain setting or the like.

Figure 23:
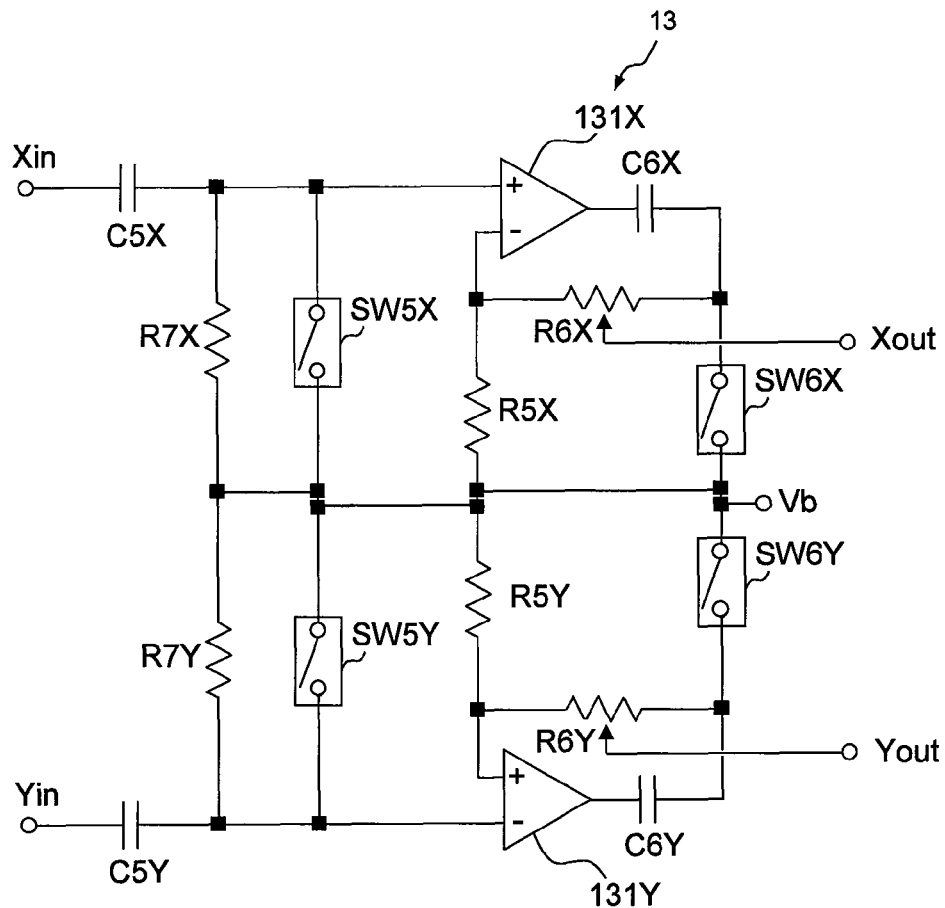
FIG. 23 is a circuit diagram of a configurational example of a transient free PGA in FIG. 22.

A configurational example of the transient free PGA 13 is shown in FIG. 23.

The transient free PGA 13 includes non-inverting amplifiers 131X and 131Y whose amplification degrees are respectively determined by the ratios of the resistance values of resistances R5X and R5Y and variable resistances R6X and R6Y. Capacitors C5X and C5Y are respectively connected in series with the inputs of the non-inverting amplifiers 131X and 131Y, and resistances R7X and R7Y are connected with a bias voltage Vb in parallel with the inputs, whereby the capacitors C5X and C5Y and the resistances R7X and R7Y constitute an HPF. Switches SW5X and SW5Y are disposed between the outputs of the HPF and the bias voltage Vb. Capacitors C6X and C6Y are respectively disposed in series with the outputs of the non-inverting amplifiers 131X and 131Y, and connected with the variable resistances R6X and R6Y. Besides, switches SW6X and SW6Y are respectively disposed between the capacitors C6X and C6Y and the bias voltage Vb. Points which are respectively short-circuited with differential inputs through the resistances R5X and R5Y and the resistances R7X and R7Y are connected with the bias voltage Vb. The output terminals Xout and Yout of the transient free PGA 13 are respectively led out of the variable resistances R6X and R6Y.

Figure 24:
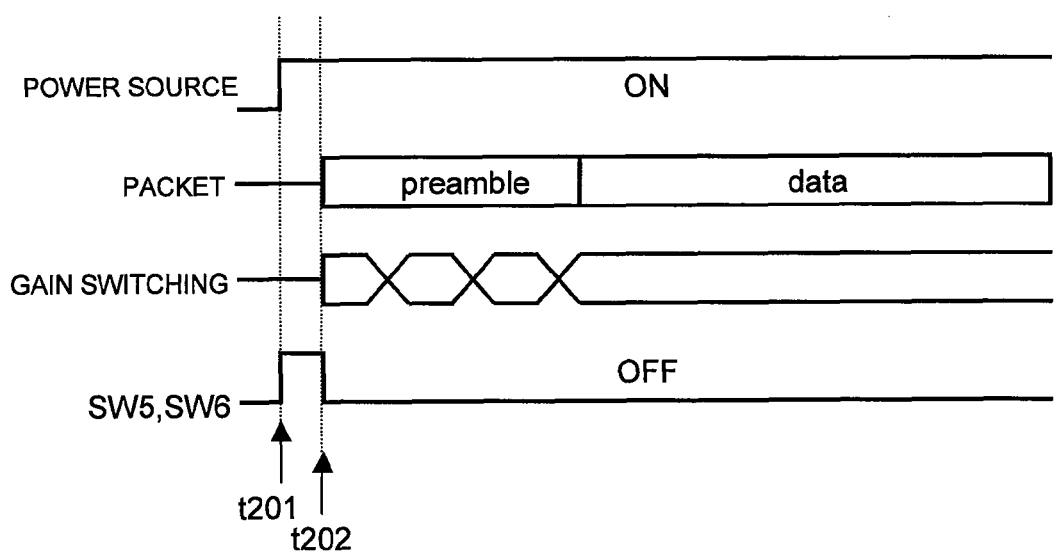
FIG. 24 is a time chart of gain setting in the configuration shown in FIG. 22.

A time chart concerning the gain setting in the configuration shown in FIG. 22 is depicted in FIG. 24.

The basic configuration of the transient free PGA 13 is a non-inverting amplifier, and a capacitance value seems to be multiplied by a gain, by disposing a capacitor C6 in series with the output of the amplifier. Therefore, a circuit scale can be made smaller, and an HPF of low cutoff frequency can be configured. Further, since the cutoff frequency need not be switched, gain settling in which a desired signal in the vicinity of DC deteriorates little becomes possible. However, when a potential difference exists at the inputs of the non-inverting amplifier, it is multiplied by the gain and is then outputted as a problem. In the embodiment of the invention, the HPF which is configured of the capacitor C5 and the resistance R7 is affixed to the inputs of the non-inverting amplifier, whereby the potential difference between the inputs is equalized. Besides, in order to quickly operate from the turn-ON of the power source, the capacitors C5 and C6 need to be charged beforehand.

Therefore, at the turn-ON of the power source at a time t201, the switches SW5 and SW6 are turned ON to short-circuit the capacitors C5 and C6 to the bias voltage Vb, respectively, and to charge these capacitors. At the packet start at a time t202, the switches SW5 and SW6 are turned OFF to complete the charging operations of the capacitors C5 and C6, respectively. The gain changes depending upon the values of the resistances R5 and R6 of the non-inverting amplifier. Merely by changing the resistance values, however, impedances constituting the filter change with the gain change, and the cutoff frequency changes to cause an unstable operation. In the embodiment of the invention, the gain can be varied by employing a variable resistance of slide type as the feedback resistance R6 of the operational amplifier. The variable resistances R6X and R6Y have configurations identical to each other.

Figure 25:
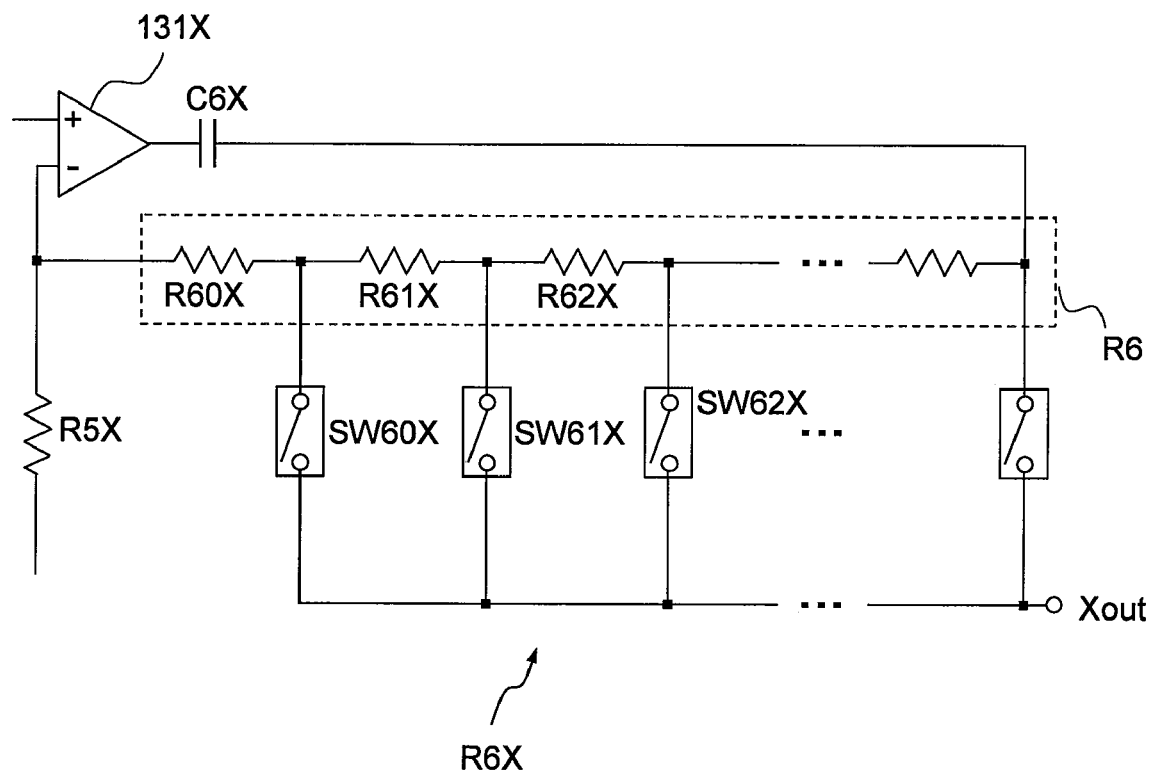
FIG. 25 is a circuit diagram of a configurational example of a variable resistance in FIG. 23.

A configurational example of the variable resistance R6X is shown in FIG. 25.

The variable resistance R6X is configured including a plurality of resistances R60X, R61X, R62X, . . . which are connected in series with one another, and a plurality of switches SW60X, SW61X, SW62X, . . . which are respectively disposed in correspondence with the resistances. Taps are led out from the series connection nodes of the respective resistances, and corresponding switches SW60, SW61, SW62, . . . are connected thereto. The switches SW60, SW61, SW62, . . . are controlled by the control logic unit 10, and the gain of the operational amplifier 131X changes depending upon the tap lead-out position thereof. According to such a gain adjustment, the impedance constituting the filter does not change, and the cutoff frequency does not change.

Owing to the above configuration, the DC offset which appears with the cutoff frequency switching can be avoided, and the DC offset can be made very small.

However, in a case where a saturation might occur in this embodiment, it is effective to jointly employ such means as turning ON the switches SW5 and SW6, thereby to reset a saturation state, or disposing saturation protection circuits at the preceding stage and final stage of the baseband unit 100.

Incidentally, the switch in this embodiment may be one which can be connected and disconnected by certain signals or the likes. By way of example, a MOS switch, a CMOS switch or the like configuration which is turned ON and OFF by signals from the control logic unit 10 is considered as the switch.

Although the invention made by the inventor has been concretely described above, it is needless to say that the present invention is not restricted to the embodiments, but that the invention is variously alterable within a scope not departing from the purport thereof.

By way of example, coils can be applied instead of resistances.

In the above, the invention made by the inventor has been chiefly described on the application of the invention to a receiving apparatus of direct conversion scheme as forms the background field thereof, but the invention can be applied to various receiving apparatuses without being especially restricted.

What is claimed is:

1. A filter circuit comprising:
a first input terminal for accepting a first input signal;
a first filter process unit which executes a filter process of the first input signal inputted through the first input terminal;
a first output terminal capable of outputting a processed result in the first filter process unit;
a second input terminal for accepting a second input signal which is in a relation of a complementary level to the first input signal;
a second filter process unit which executes a filter process of the second input signal inputted through the second input terminal; and
a second output terminal capable of outputting a processed result in the second filter process unit,
wherein the first filter process unit and the second filter process unit include a plurality of first capacitors for forming a high-pass filter;
a plurality of second capacitors capable of altering a cutoff frequency of the high-pass filter by being connected in parallel with the first capacitors;
a first switch capable of coupling one terminal of one of the second capacitors to one terminal of one of the first capacitors;
a second switch capable of coupling the other terminal of said one of the second capacitors to the other terminal of said one of the first capacitors;
a resistance for attenuating an amplitude of an input voltage to be fed to said one of the second capacitors, by being connected in series with said one of the second capacitors;
a third switch capable of coupling the resistance to one end of said one of the second capacitors; and
a fourth switch capable of feeding a predetermined bias voltage to the other end of said one of the second capacitors,
wherein the second capacitor is charged through the resistance in a state where the first switch and the second switch are turned OFF and where the third switch and the fourth switch are turned ON, and
wherein the first input terminal and the second input terminal are coupled through the resistance.

2. A filter circuit comprising:
a first input terminal for accepting a first input signal;
a first filter process unit which executes a filter process of the first input signal inputted through the first input terminal;
a first output terminal capable of outputting a processed result in the first filter process unit;
a second input terminal for accepting a second input signal which is in a relation of a complementary level to the first input signal;
a second filter process unit which executes a filter process of the second input signal inputted through the second input terminal; and a second output terminal capable of outputting a processed result in the second filter process unit, wherein the first filter process unit and the second filter process unit include a plurality of first capacitors for forming a high-pass filter;

a plurality of second capacitors capable of altering a cutoff frequency of the high-pass filter by being connected in parallel with the first capacitors;

a first switch capable of coupling one terminal of one of the second capacitors to one terminal of one of the first capacitors;

a second switch capable of coupling the other terminal of said one of the second capacitors to the other terminal of said one of the first capacitors;

a resistance for attenuating an amplitude of an input voltage to be fed to said one of the second capacitors, by being connected in series with said one of the second capacitors;

a third switch capable of coupling the resistance to one end of said one of the second capacitors; and a fourth switch capable of feeding a predetermined bias voltage to the other end of said one of the second capacitors, wherein the second capacitor is charged through the resistance in a state where the first switch and the second switch are turned OFF and where the third switch and the fourth switch are turned ON, and a fifth switch which is capable of coupling the first input terminal and the second input terminal through the resistance.

3. A receiving apparatus comprising:

a first amplifier which amplifies a received signal;

a mixer which performs a frequency conversion as to an output signal of the first amplifier; and a baseband unit which is arranged at a stage posterior to the mixer and which is capable of processing an output signal of the mixer, wherein the baseband unit includes a low-pass filter unit which executes a filter process of a signal transmitted through the mixer;

a second amplifier which amplifies an output signal of the low-pass filter; and a high-pass filter unit which executes a filter process of an output signal of the second amplifier, wherein the high-pass filter unit comprises:

a first input terminal for accepting a first input signal;

a first filter process unit which executes a filter process of the first input signal inputted through the first input terminal;

a first output terminal capable of outputting a processed result in the first filter process unit;

a second input terminal for accepting a second input signal which is in a relation of a complementary level to the first input signal;

a second filter process unit which executes a filter process of the second input signal inputted through the second input terminal; and a second output terminal capable of outputting a processed result in the second filter process unit, wherein the first filter process unit and the second filter process unit include a plurality of first capacitors for forming a high-pass filter;

a plurality of second capacitors capable of altering a cutoff frequency of the high-pass filter by being connected in parallel with the first capacitors;

a first switch capable of coupling one terminal of one of the second capacitors to one terminal of one of the first capacitors;

a second switch capable of coupling the other terminal of said one of the second capacitors to the other terminal of said one of the first capacitors;

a resistance for attenuating an amplitude of an input voltage to be fed to said one of the second capacitors, by being connected in series with said one of the second capacitors;

a third switch capable of coupling the resistance to one end of said one of the second capacitors; and a fourth switch capable of feeding a predetermined bias voltage to the other end of said one of the second capacitors, wherein the second capacitor is charged through the resistance in a state where the first switch and the second switch are turned OFF and where the third switch and the fourth switch are turned ON, and wherein the receiving apparatus further comprises:

a DC offset canceling circuit which forms a DC offset correction code for canceling a DC offset, on the basis of a signal of an output side of the second amplifier, and which feeds the correction code back to an input side of the amplifier.

4. A receiving apparatus comprising:

a first amplifier which amplifies a received signal;

a mixer which performs a frequency conversion as to an output signal of the first amplifier; and a baseband unit which is arranged at a stage posterior to the mixer and which is capable of processing an output signal of the mixer, wherein the baseband unit includes a low-pass filter unit which executes a filter process of a signal transmitted through the mixer;

a second amplifier which amplifies an output signal of the low-pass filter; and a high-pass filter unit which executes a filter process of an output signal of the second amplifier, wherein the high-pass filter unit comprises:

a first input terminal for accepting a first input signal;

a first filter process unit which executes a filter process of the first input signal inputted through the first input terminal;

a first output terminal capable of outputting a processed result in the first filter process unit;

a second input terminal for accepting a second input signal which is in a relation of a complementary level to the first input signal;

a second filter process unit which executes a filter process of the second input signal inputted through the second input terminal; and a second output terminal capable of outputting a processed result in the second filter process unit, wherein the first filter process unit and the second filter process unit include a plurality of first capacitors for forming a high-pass filter;

a plurality of second capacitors capable of altering a cutoff frequency of the high-pass filter by being connected in parallel with the first capacitors;

a first switch capable of coupling one terminal of one of the second capacitors to one terminal of one of the first capacitors;

a second switch capable of coupling the other terminal of said one of the second capacitors to the other terminal of said one of the first capacitors;

a resistance for attenuating an amplitude of an input voltage to be fed to said one of the second capacitors, by being connected in series with said one of the second capacitors;
a third switch capable of coupling the resistance to one end of said one of the second capacitors; and
a fourth switch capable of feeding a predetermined bias voltage to the other end of said one of the second capacitors,
wherein the second capacitor is charged through the resistance in a state where the first switch and the second switch are turned OFF and where the third switch and the fourth switch are turned ON, and
wherein the receiving apparatus further comprises:
a DC offset canceling circuit which forms a DC offset correction code for canceling a DC offset, by executing an averaging process of offset information extracted on the basis of a signal of an output side of the second amplifier, and which feeds the correction code back to an input side of the amplifier.

5. A receiving apparatus comprising:
a first amplifier which amplifies a received signal;
a mixer which performs a frequency conversion as to an output signal of the first amplifier; and
a baseband unit which is arranged at a stage posterior to the mixer and which is capable of processing an output signal of the mixer,
wherein the baseband unit includes a low-pass filter unit which executes a filter process of a signal transmitted through the mixer;
a second amplifier which amplifies an output signal of the low-pass filter; and
a high-pass filter unit which executes a filter process of an output signal of the second amplifier,
wherein the high-pass filter unit comprises:
a first input terminal for accepting a first input signal;
a first filter process unit which executes a filter process of the first input signal inputted through the first input terminal;
a first output terminal capable of outputting a processed result in the first filter process unit;
a second input terminal for accepting a second input signal which is in a relation of a complementary level to the first input signal;
a second filter process unit which executes a filter process of the second input signal inputted through the second input terminal; and
a second output terminal capable of outputting a processed result in the second filter process unit,
wherein the first filter process unit and the second filter process unit include a plurality of first capacitors for forming a high-pass filter;
a plurality of second capacitors capable of altering a cutoff frequency of the high-pass filter by being connected in parallel with the first capacitors;
a first switch capable of coupling one terminal of one of the second capacitors to one terminal of one of the first capacitors;
a second switch capable of coupling the other terminal of said one of the second capacitors to the other terminal of said one of the first capacitors;
a resistance for attenuating an amplitude of an input voltage to be fed to said one of the second capacitors, by being connected in series with said one of the second capacitors;
a third switch capable of coupling the resistance to one end of said one of the second capacitors; and
a fourth switch capable of feeding a predetermined bias voltage to the other end of said one of the second capacitors,
wherein the second capacitor is charged through the resistance in a state where the first switch and the second switch are turned OFF and where the third switch and the fourth switch are turned ON, and
wherein the receiving apparatus further comprises:
a DC offset canceling circuit which forms a DC offset correction code for canceling a DC offset, by executing an averaging process of offset information extracted on the basis of a signal of an output side of the second amplifier, and which feeds the correction code back to an input side of the amplifier; and
a DC servo circuit which has a first control mode where a signal following up a DC offset fluctuation of low frequency can be detected and fed back to the input side of the amplifier, and a second control mode where a signal following up a DC offset fluctuation of low frequency is detected so as to revise the DC offset correction code on the basis of the detected signal.

6. A receiving apparatus comprising:
a first amplifier which amplifies a received signal;
a mixer which performs a frequency conversion as to an output signal of the first amplifier; and
a baseband unit which is arranged at a stage posterior to the mixer and which is capable of processing an output signal of the mixer,
wherein the baseband unit includes a low-pass filter which executes a filter process of a signal outputted from the mixer;
a second amplifier which amplifies an output signal of the low-pass filter;
a third amplifier which amplifies an output signal of the second amplifier; and
a high-pass filter unit which executes a filter process of an output signal of the third amplifier,
wherein the high-pass filter unit comprises:
a first input terminal for accepting a first input signal;
a first filter process unit which executes a filter process of the first input signal inputted through the first input terminal;
a first output terminal capable of outputting a processed result in the first filter process unit;
a second input terminal for accepting a second input signal which is in a relation of a complementary level to the first input signal;
a second filter process unit which executes a filter process of the second input signal inputted through the second input terminal; and
a second output terminal capable of outputting a processed result in the second filter process unit,
wherein the first filter process unit and the second filter process unit include a plurality of first capacitors for forming a high-pass filter;
a plurality of second capacitors capable of altering a cutoff frequency of the high-pass filter by being connected in parallel with the first capacitors;
a first switch capable of coupling one terminal of one of the second capacitors to one terminal of one of the first capacitors;
a second switch capable of coupling the other terminal of said one of the second capacitors to the other terminal of said one of the first capacitors;

a resistance for attenuating an amplitude of an input voltage to be fed to said one of the second capacitors, by being connected in series with said one of the second capacitors;

a third switch capable of coupling the resistance to one end of said one of the second capacitors; and a fourth switch capable of feeding a predetermined bias voltage to the other end of said one of the second capacitors, wherein the second capacitor is charged through the resistance in a state where the first switch and the second switch are turned OFF and where the third switch and the fourth switch are turned ON , and wherein the receiving apparatus further comprises:

a first DC offset canceling circuit which forms a DC offset correction code for canceling a DC offset, on the basis of the signal of an output side of the second amplifier, and which feeds the correction code back to an input side of the second amplifier; and a second DC offset canceling circuit which forms a DC offset correction code for canceling a DC offset, on the basis of the signal of an output side of the third amplifier, and which feeds the correction code back to an input side of the third amplifier.

7. A receiving apparatus comprising:

a first amplifier which amplifies a received signal;

a mixer which performs a frequency conversion as to an output signal of the first amplifier; and a baseband unit which is arranged at a stage posterior to the mixer and which is capable of processing an output signal of the mixer, wherein the baseband unit includes a low-pass filter which executes a filter process of a signal outputted from the mixer;

a second amplifier which amplifies an output signal of the low-pass filter;

a third amplifier which amplifies an output signal of the second amplifier; and a high-pass filter unit which executes a filter process of an output signal of the third amplifier, wherein the high-pass filter unit comprises:

a first input terminal for accepting a first input signal;

a first filter process unit which executes a filter process of the first input signal inputted through the first input terminal;

a first output terminal capable of outputting a processed result in the first filter process unit;

a second input terminal for accepting a second input signal which is in a relation of a complementary level to the first input signal;

a second filter process unit which executes a filter process of the second input signal inputted through the second input terminal; and a second output terminal capable of outputting a processed result in the second filter process unit, wherein the first filter process unit and the second filter process unit include a plurality of first capacitors for forming a high-pass filter;

a plurality of second capacitors capable of altering a cutoff frequency of the high-pass filter by being connected in parallel with the first capacitors;

a first switch capable of coupling one terminal of one of the second capacitors to one terminal of one of the first capacitors;

a second switch capable of coupling the other terminal of said one of the second capacitors to the other terminal of said one of the first capacitors;

a resistance for attenuating an amplitude of an input voltage to be fed to said one of the second capacitors, by being connected in series with said one of the second capacitors;

a third switch capable of coupling the resistance to one end of said one of the second capacitors; and a fourth switch capable of feeding a predetermined bias voltage to the other end of said one of the second capacitors, wherein the second capacitor is charged through the resistance in a state where the first switch and the second switch are turned OFF and where the third switch and the fourth switch are turned ON , and wherein the receiving apparatus further comprises:

a first DC offset canceling circuit which forms a DC offset correction code for canceling a DC offset, on the basis of the signal of an output side of the second amplifier, and which feeds the correction code back to an input side of the second amplifier;

a second DC offset canceling circuit which forms a DC offset correction code for canceling a DC offset, on the basis of the signal of an output side of the third amplifier, and which feeds the correction code back to an input side of the third amplifier; and a DC servo circuit which has a first control mode where a signal following up a DC offset fluctuation of low frequency can be detected and fed back to the input side of the third amplifier, and a second control mode where a signal following up a DC offset fluctuation of low frequency is detected so as to revise the DC offset correction code on the basis of the detected signal.

8. A receiving apparatus comprising a first amplifier which amplifies a received signal;

a mixer which performs a frequency conversion as to an output signal of the first amplifier; and a baseband unit which is arranged at a stage posterior to the mixer and which is capable of processing an output signal of the mixer, wherein the baseband unit includes a low-pass filter which executes a filter process of an output signal from the mixer; and a second amplifier which amplifies an output signal of the low-pass filter, wherein the second amplifier includes a high-pass filter unit which executes a filter process of an output signal of the low-pass filter; and an amplification unit which is arranged at a stage posterior to the high-pass filter unit and which is capable of adjusting its gain without switching the cutoff frequency of the high-pass filter unit, wherein the amplification unit includes an operational amplifier which has a non-inverting input terminal, an inverting input terminal and an output terminal and which is capable of amplifying a potential difference between the non-inverting input terminal and the inverting input terminal and then outputting the amplified potential difference from the output terminal; and a plurality of capacitors which are coupled to the output terminal of the operational amplifier; and a plurality of feedback resistances which are capable of feeding the amplified potential difference back to the inverting input terminal of the operational amplifier through the capacitors, wherein values of the feedback resistances are altered, whereby the gain adjustment of the operational amplifier can be made.

* * * * *